United States Patent
Gunn et al.

(10) Patent No.: US 12,196,790 B2
(45) Date of Patent: Jan. 14, 2025

(54) SYSTEM AND METHOD FOR CALIBRATING A NON-CONTACT ENERGY METERING ASSEMBLY

(71) Applicant: SCHNEIDER ELECTRIC USA, INC., Boston, MA (US)

(72) Inventors: Colin N. Gunn, Cowichan Bay (CA); Stewart John Harding, Victoria (CA); Benedikt Theodor Huber, Victoria (CA)

(73) Assignee: SCHNEIDER ELECTRIC USA, INC., Boston, MA (US)

( * ) Notice: Subject to any disclaimer, the term of this patent is extended or adjusted under 35 U.S.C. 154(b) by 149 days.

(21) Appl. No.: 18/170,267

(22) Filed: Feb. 16, 2023

(65) Prior Publication Data

US 2024/0210453 A1 Jun. 27, 2024

Related U.S. Application Data

(60) Provisional application No. 63/476,728, filed on Dec. 22, 2022.

(51) Int. Cl.
| | | |
|---|---|---|
| *G01R 22/08* | (2006.01) | |
| *G01R 15/14* | (2006.01) | |
| *G01R 35/00* | (2006.01) | |

(52) U.S. Cl.
CPC .......... *G01R 22/08* (2013.01); *G01R 15/144* (2013.01); *G01R 35/005* (2013.01)

(58) Field of Classification Search
CPC .......... G01R 1/28; G01R 11/00; G01R 11/32; G01R 21/005; G01R 22/00; G01R 35/005; G01R 35/04; G05B 2219/37348
See application file for complete search history.

(56) References Cited

U.S. PATENT DOCUMENTS

| | | | |
|---|---|---|---|
| 2012/0078555 A1* | 3/2012 | Banhegyesi | G01R 21/133 702/64 |
| 2012/0200293 A1 | 8/2012 | Carpenter et al. | |

(Continued)

FOREIGN PATENT DOCUMENTS

WO 2016028274 A1 2/2016

OTHER PUBLICATIONS

Extended European Search Report from corresponding European Application No. 23213242.3 dated May 8, 2024.

(Continued)

*Primary Examiner* — Tung X Nguyen
(74) *Attorney, Agent, or Firm* — Lando & Anastasi, LLP

(57) ABSTRACT

This disclosure relates generally to an energy metering assembly configured to measure current and voltage of a one or more primary conductors, the energy metering assembly comprising a core; a coil having a plurality of turns, the coil being positioned around the core when securing the core to the one or more primary conductors; a voltage sensor, the voltage sensor being configured to sense a voltage of a one or more primary conductors; and a controller coupled to the coil and the voltage sensor, the controller being configured to determine a voltage of the one or more primary conductors, determine a current of the one or more primary conductors, and responsive to determining the voltage and the current, determine the power carried by the one or more primary conductors.

34 Claims, 22 Drawing Sheets

(56) References Cited

U.S. PATENT DOCUMENTS

| | | | |
|---|---|---|---|
| 2015/0002137 A1* | 1/2015 | Patel | G01R 35/00 |
| | | | 324/130 |
| 2015/0331017 A1* | 11/2015 | Raghunathan | G01R 19/0084 |
| | | | 324/754.27 |
| 2016/0061864 A1 | 3/2016 | White et al. | |
| 2016/0187449 A1 | 6/2016 | Beiner et al. | |
| 2020/0292652 A1 | 9/2020 | Suetterlin | |
| 2021/0318357 A1 | 10/2021 | Parker et al. | |

OTHER PUBLICATIONS

Brochure, DIRIS Digiware, Power metering and monitoring system for AC and DC electrical installations, When energy matters, SOCOMEC Innovation Power Solutions, Nov. 2020, pp. 14.
Brochure, TR/iTR sensors, Split-core AC current sensors used with DIRIS Digiware, DIRIS A-40 and DIRIS B, Jan. 2018, pp. 2.

* cited by examiner

SYSTEM AND METHOD FOR CALIBRATING A NON-CONTACT ENERGY METERING ASSEMBLY

CROSS-REFERENCE TO RELATED APPLICATIONS

This application claims priority under 35 U.S.C. § 119(e) to the application titled SYSTEM AND METHOD FOR CALIBRATING A NON-CONTACT ENERGY METERING ASSEMBLY, Provisional Application No. 63/476,728, filed Dec. 22, 2022, which is incorporated by reference for all purposes in its entirety.

BACKGROUND

Electronic and/or electrical devices may consume power and/or energy. Meters that connect between an electronic and/or electrical device and a power and/or energy source may measure the energy used over time by the electronic device. In some cases, operators of such electronic and/or electrical devices may use meters to measure the amount of power and/or energy used by the electronic and/or electrical device, and use the information for a variety of purposes, including charging for energy used by the electronic and/or electrical devices.

SUMMARY

According to at least one aspect of the present disclosure, an energy metering assembly is provided. The energy metering assembly is configured to measure current and voltage of one or more primary conductors, and the energy metering assembly comprises: a core; coil having a plurality of turns, the coil being positioned around the core when securing the core to the one or more primary conductors; a non-contact voltage sensor, the voltage sensor being configured to sense a voltage of the one or more primary conductors; and a controller communicatively coupled to the voltage sensor, the controller being configured to determine a voltage of the one or more primary conductors, determine a current of the one or more primary conductors, and responsive to determining the voltage and the current, determine the power and/or energy carried by the one or more primary conductors.

In some examples, a voltage meter is coupled to the one or more primary conductors and communicatively coupled to the energy metering assembly and configured to provide a voltage measurement, taken at a point different from a point where the voltage sensor senses the voltage of the one or more primary conductors, to the energy metering assembly. In various examples, the voltage meter provides the voltage measurement to the energy metering assembly at intervals. In many examples, the controller further determines the voltage of the one or more primary conductors by adjusting the voltage based on the voltage measurement.

In some examples, the system further comprises a voltage measurement circuit coupled to the voltage sensor and configured to provide a processed analog signal to the controller, the analog signal being indicative of at least one or more of the voltage magnitude and phase of the voltage of the one or more primary conductors. In various examples, the controller determines the voltage of the one or more primary conductors responsive to receiving the processed analog signal provided by the voltage measurement circuit. In many examples, the system further comprises a flexible bus having at least two ends, the flexible bus being coupled to the voltage measurement circuit at one end and coupled to the controller at another end.

In some examples, the system further comprises a temperature sensor configured to sense a temperature of the one or more primary conductors and provide the temperature to the controller. In various examples, the controller is further configured to adjust the voltage responsive to receiving the temperature provided by the temperature sensor. In many examples, the voltage sensor detects an electrical field that is proportional to the voltage. In some examples, the voltage sensor is coupled to a flexible bus, and the flexible bus is coupled to the controller. In various examples, the voltage sensor is rigidly coupled to a circuit configured to process the voltage and provide a processed voltage signal to the controller. In many examples, the controller further is configured to receive input from a temperature sensor configured to measure a temperature of the one or more primary conductors. In some examples, the system further comprises a voltage meter configured to communicatively couple to the energy metering system and configured to measure the voltage of the one or more primary conductors.

In some examples, the voltage meter is configured to provide a voltage reading to the energy metering assembly. In various examples, the energy metering system is configured to request the voltage reading and to calibrate the voltage sensor using the voltage reading. In many examples, the voltage meter provides one or more voltage readings at intervals.

In some examples, the assembly further comprises a first sensor configured to sense a temperature of the one or more primary conductors, and a second sensor configured to sense an ambient temperature of the energy metering assembly. In many examples, the controller is further configured to compare the temperature of the one or more primary conductors and the ambient temperature to one or more historical temperature data indicative of historical temperatures of the one or more primary conductors and historical ambient temperatures, detect, based on the ambient temperature and the historical temperature data, a change in the temperature of the one or more primary conductors indicative of a fault.

In many examples, the fault includes at least one of bonding trending to failure, electrical contacts trending to failure, corrosion, connections loosening with time, or other issues leading to abnormal heating of the one or more primary conductors. In various examples, the controller is further configured to calibrate the energy metering assembly when current carried on the one or more primary conductors is below a threshold current level, detect a second voltage of the one or more primary conductors when current carried on the one or more primary conductors is above a threshold current level, characterize a difference between voltage and the second voltage when current carried on the one or more primary conductors is above the threshold current level, determine a normal impedance of the one or more primary conductors, and provide an alarm when an impedance of the one or more primary conductors deviates by a threshold impedance amount from the normal impedance. In some examples, the impedance of the one or more primary conductors is an impedance of an electrical distribution system between a voltage meter and the energy metering assembly.

According to at least one aspect of the present disclosure, a method of determining power and/or energy provided to a load is provided. The method comprises taking a voltage measurement of one or more primary conductors; sensing a current measurement of a secondary conductor; responsive to taking the voltage measurement of the one or more primary conductors, determining a voltage value of the one or more primary conductors; responsive to sensing the current measurement of the secondary conductor, determining a current value of the one or more primary conductors based on the current measurement of the secondary conductor; receiving a voltage calibration measurement; responsive to receiving the voltage calibration measurement, adjusting the voltage value based on the voltage calibration measurement; and responsive to adjusting the voltage value, determining the power and/or energy provided to the load based on the voltage value and the current value.

In some examples, the method further comprises requesting voltage calibration measurements and adjusting the voltage value based on the voltage calibration measurements. In various examples, the method further comprises sensing a temperature of the one or more primary conductors, and adjusting the voltage value based on the temperature of the one or more primary conductors. In many examples, the method further comprises adjusting the voltage value based on the temperature at a first circuit and further adjusting the voltage value based on the voltage calibration measurement at a second circuit. In some examples, the voltage calibration measurement is received from a voltage meter configured to directly sense a voltage of the one or more primary conductors at a point different from the point where the voltage measurement is taken.

According to at least one aspect of the present disclosure, a non-transitory, computer-readable medium is provided, the medium containing computer-executable instructions thereon, the instructions instructing at least one processor to: receive a voltage measurement of one or more primary conductors; receive a current measurement of a secondary conductor; responsive to receiving the voltage measurement of the one or more primary conductors, determine a voltage value of the one or more primary conductors; responsive to receiving a current measurement of the secondary conductor, determine a current value of the one or more primary conductors based on the current measurement of the secondary conductor; receive a voltage calibration measurement; responsive to receiving the voltage calibration measurement, adjust the voltage value based on the voltage calibration measurement; and responsive to adjusting the voltage value, determine a power and/or energy used by a load based on the voltage value and the current value.

In some examples, the instructions further instruct the at least one processor to request voltage calibration measurements and adjust the voltage value based on the voltage calibration measurements. In various examples, the instructions further instruct the at least one processor to receive a temperature of the one or more primary conductors and adjust the voltage value based on the temperature of the one or more primary conductors. In many examples, the instructions further instruct the at least one processor to adjust the voltage value based on the temperature of the one or more primary conductors at a first location and adjust the voltage value based on the voltage calibration measurements at a second location different from the first location. In some examples, the instructions further instruct the at least one processor to receive the voltage calibration measurement from a voltage meter configured to directly sense a voltage of the one or more primary conductors.

According to at least one aspect of the present disclosure, a method of calculating a characteristic impedance of a power and/or energy distribution system is disclosed, the method comprising: determining a first voltage at a first point in the power and/or energy distribution system; determining a second voltage at a second point in the power and/or energy distribution system; determining a current carried through the power and/or energy distribution system; determine, based on one or more of the first voltage, the second voltage, and the current, an impedance of the power and/or energy distribution system between the first point and the second point; monitor the impedance over time; based on the impedance over time, determine a characteristic impedance of the power and/or energy distribution system between the first point and the second point; and provide an alarm responsive to the impedance of the power and/or energy distribution system varying by at least a threshold impedance amount away from the characteristic impedance.

According to at least one aspect of the present disclosure, an energy metering assembly configured to measure a current and voltage of one or more primary conductors is disclosed. The energy metering assembly comprises a core including a first core section and a second core section separate from the first core section, the second core section being coupled to the first core section to secure the core to the one or more primary conductors; a coil having a plurality of turns, the coil being positioned around the first section of the core when securing the core to the one or more primary conductors; a non-contact voltage sensor, the voltage sensor being configured to sense a voltage of one or more primary conductors; a controller communicatively coupled to the voltage sensor, the controller being configured to determine a voltage value of the one or more primary conductors, determine a current value of the one or more primary conductors, and responsive to determining the voltage value and the current value, determine the power and/or energy carried by the one or more primary conductors; and a shroud including a first shroud section configured to cover at least a portion of the first core section, and a second shroud section configured to cover at least a portion of the second core section.

In various examples, the assembly further comprises one or more springs coupled to the second shroud section and configured to bias the second core section within the shroud. In some examples, the one or more springs further includes at least one point of contact configured to engage the second shroud section of the shroud. In various examples, the first shroud section is configured to be releasably secured to the second shroud section. In many examples, the first core section includes a first end and a second end and the second core section includes a third end and a fourth end, the first end of the first core section being configured to mate with the third end of the second core section and the second end of the first core section being configured to mate with the fourth end of the second core section.

In some examples, at least one of the first end, second end, third end, and fourth end include a chamfer. In various examples, the first core section and second core section are fabricated from a unitary core, with the unitary core having been cut into the first core section and the second core section. In many examples, the core is cut into the first core section and the second core section at a diagonal. In some examples, the first core section and second core section are lapped sections of the core. In various examples, the core is formed from nano-crystalline material. In many examples, the assembly further comprises an input coupled to the controller, the input being configured to receive an input cable. In many examples, the input is further configured to receive power and/or energy and receive and transmit communications.

In various examples, the assembly further comprises a first temperature sensor configured to sense a temperature of the one or more primary conductors. In many examples, the assembly further comprises a second temperature sensor configured to sense an ambient temperature around the energy metering assembly. In some examples, the controller is further configured to compare a first temperature-related value, based on the ambient temperature and the temperature of the one or more primary conductors, to one or more historic temperature-related values; and determine that the first temperature-related value deviates from an expected temperature-related value based on the one or more historic temperature related values. In various examples, the assembly further comprises a voltage measurement circuit coupled to the voltage sensor and to controller, the voltage measurement circuit being configured to provide the voltage value from the voltage sensor to the controller. In many examples, the assembly further comprises a flexible bus coupled between the controller and the voltage sensor, the controller and voltage sensor being positioned on opposite sides of the coil, the voltage sensor being on the side of the coil closer to the one or more primary conductors.

According to at least one aspect of the present disclosure, a shroud for an energy metering assembly is provided. The shroud comprises a first shroud section configured to contain at least a first core section; a second shroud section configured to contain at least a second core section; a connector coupled to the first shroud section and the second shroud section, allowing the second shroud section to move relative to the first shroud section between an open position and a closed position; a first latch portion coupled to the first shroud section; and a second latch portion coupled to the second shroud section and configured to mate with the first latch portion in the closed position.

In many examples, the shroud further includes a first corner, a second corner, a third corner, and a fourth corner, wherein the first corner of the shroud is configured to mate with a fourth corner of another shroud and the second corner of the shroud is configured to mate with a third corner of the another shroud. In some examples, the shroud further comprises a first side on the first shroud section and a second side on the first shroud section, the first side of the first shroud section of the shroud being configured to mate with a second side of a second shroud section of another shroud.

In various examples, the second shroud section is coupled to the hinge at an offset in the open position relative to the first shroud section. In many examples, the second shroud section is coupled to the hinge not at an offset in the open position relative to the first shroud section. In some examples, the first shroud section includes an opening configured to receive a zip tie or other fastener. In various examples, the first shroud section and second shroud section are diagonally matched so as to match a diagonal cut in the first core section and second core section. In at least one examples, the first shroud section and second shroud section are horizontally matched so as to match a horizontal cut in the first core section and second core section. In some examples, at least one of the first shroud section and the second shroud section includes an identifying marker configured to uniquely identify an energy metering assembly within the shroud.

According to at least one aspect of the present disclosure, a method of nesting one or more shrouds together, each shroud of the one or more shrouds having a first corner, a second corner, a third corner, and a fourth corner, is provided. The method comprises: securing a first shroud to a first one or more primary conductors; securing a second shroud to a second one or more primary conductors; and nesting a fourth corner of the first shroud with a first corner of the second shroud.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
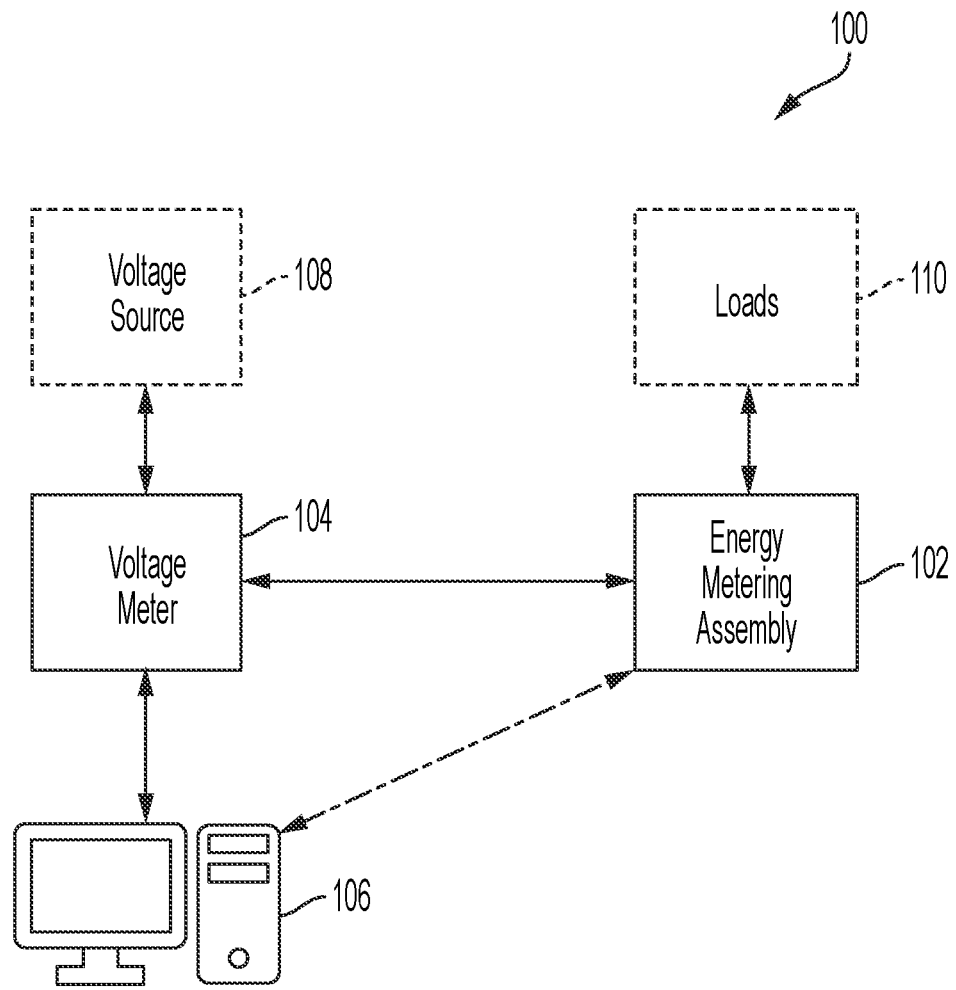
FIG. 1 illustrates an energy metering system according to an example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Some examples and embodiments disclosed herein relate to an energy metering system having or using an energy metering assembly. The energy metering assembly may work in tandem with a voltage meter and a computer to accurately and reliably calculate the power and/or energy consumed by a load coupled to a given power line. The energy metering assemblies disclosed herein may, in some examples, be mobile, that is, capable of being removed from one power line and/or load and attached to another power line and/or load without requiring disassembly of the power lines or loads. The energy metering assembly may transmit and receive data, wirelessly or wired, relating to voltage, current, resistance, power and/or energy, and other quantities. In some examples, the energy metering assembly may use a non-contact voltage sensor, such as a capacitive voltage sensor, to detect and/or measure voltage. Inaccuracies in the voltages detected by the non-contact voltage sensor may be corrected using data provided by a voltage sensor such as a voltage sensor incorporated into the voltage meter. The energy metering assembly may detect current using a non-contact current sensor, such as a magnetic core (or simply "core") and secondary conductor of a current transformer or a Rogowski current sensor. The energy metering assembly may adjust the current and voltage values using other information, for example, temperature inputs related to the ambient temperature and/or temperature of the primary conductor or voltage sensor, and so forth. The energy metering assembly may determine power and/or energy using the current and voltage data, or other data, and provide the power and/or energy data. The energy metering assembly may have a split core, to make it easier to remove and add to power lines (such power lines may act as primary conductors), and may have a shroud designed to accommodate multiple nesting topologies, allowing multiple such energy metering assemblies to sit side-by-side in a secure, compact manner. Various example and embodiments of the energy metering assembly and energy metering system will be discussed herein.

FIG. 1 illustrates an energy metering system, generally indicated at 100, according to an example. The system 100 includes at least one energy metering assembly (assembly) 102, a voltage meter 104, a computer system 106, a voltage source 108, and one or more loads (loads) 110. The assembly 102 is coupled to the loads 110, the voltage meter 104, and the computer system 106. In some examples, the assembly 102 may be communicatively coupled to the voltage meter 104 or the computer system 106 in addition to or instead of being physically coupled to the voltage meter 104 or computer system 106. The assembly 102 need not be physically coupled to the voltage meter 104 or computer system 106. The voltage meter 104 is coupled to the computer system 106 and the voltage source 108. In some examples, the voltage meter 104 may be communicatively coupled to the computer system 106 in addition to or instead of being physically coupled to the computer system 106.

The energy metering assembly 102 is configured to monitor and/or meter the power and/or energy used by the loads 110. The assembly 102 is mobile. That is, the assembly 102 can be attached and detached from a primary conductor or wire so that the assembly 102 can be moved from monitoring one subset of the loads 110 to a different subset of the loads 110. The assembly 102 can also nest with other assemblies 102 in at least two configurations. The assembly 102 includes one or more of a core, secondary conductor, voltage sensor, temperature sensor, controller or control circuit, and voltage measurement circuit. The assembly 102 includes a shroud, the shroud being a structure that contains and holds some or all of the parts of the assembly 102. Details of the construction and components of the assembly 102 will be discussed in greater detail herein, for example with respect to FIGS. 2A and 2B, 6A and 6B, 8, 9A-9C, and generally throughout.

In some examples, the assembly 102 monitors the current and voltage provided to one or more of the loads 110. The assembly 102 determine the power and/or energy consumed by the one or more loads 110 based on the current and voltage detected by the assembly 102. For example, the assembly 102 may calculate power using an equation such as P=VI, where P is the power in Watts, V is the voltage in Volts, and I is the current in Amperes. In some examples, the assembly 102 calculates power and/or energy by sampling the voltage and current waveforms at multiple times per cycle and at a high data rate. Other parameters, such as phase angle, power factor, reactive (VARS) and real (KW) power, may also be calculated using the sampled voltage and current waveform data. Power and/or energy calculations may be performed using vector math and/or dot products. The assembly 102 is configured to transmit power and/or energy, current, and voltage information to the voltage meter 104 or computer system 106. In some examples, the assembly 102 transmits information wirelessly or via a wired connection. In some examples, the voltage sensor of the assembly 102 is a wireless (i.e., non-contact) sensor, such as a capacitive sensor. The voltage sensor of the assembly 102 may require calibration, for example, at the beginning of operation, on request, or at intervals. To calibrate the voltage sensor, the assembly 102 requests calibration data from the voltage meter 104 or computer system 106, or receives calibration data or power and/or energy metering data from the voltage meter 104 or computer system 106. The assembly 102 calibrates the voltage sensor based on the calibration or power and/or energy metering data received from the voltage meter 104 or computer system 106.

The voltage meter 104 monitors the voltage of the voltage source 108. The voltage source 108 is generally coupled to the loads 110 and configured to provide a voltage and/or power and/or energy to the loads 110. For example, the voltage source 108 may be an outlet, generator, utility power and/or energy grid, or any other power and/or energy source. The voltage meter 104 is coupled between the voltage source 108 and the loads 110 such that the voltage meter 104 accurately senses the voltage received by the loads 110 and/or provided by the voltage source 108. More than one voltage meter 104 may be provided to sense the voltage at particular parts of the system 100. That is, the voltage meter 104 can sense the voltage for a particular subset of loads 110 or subpart of a load. The voltage meter 104 provides the voltages it senses to the assembly 102. The assembly 102 uses the provided voltages to calibrate the voltage sensor or correct/modify the voltage values sensed by the voltage sensor. The voltage meter 104 may also store and process any information received from the assembly 102, and may transmit said information to the computer system 106.

The computer system 106 receives information from the voltage meter 104 and/or energy metering assembly 102. The information received may include voltage, current, temperature (ambient temperature of the assembly and the temperature of the voltage sensor), power (instantaneous, average, root-mean-square (RMS), real power, reactive power, energy such as real kWh and reactive kVARh, and so forth), or other data. The computer system 106 analyzes the information to determine how the voltage measured by the assembly 102 differs from the true voltage measured by the voltage meter 104 based on operational conditions. For example, if the assembly 102 uses a non-contact voltage sensor (such as a capacitive voltage sensor), the accuracy of the voltage sensor may depend strongly on temperature and position, which can have a strong effect on electromagnetic properties of the devices, such as capacitive coupling. The computer system 106 may, based on historical data for a given assembly 102, create adjustments and/or a profile for the assembly 102 that automatically compensates for measurement error of the voltage, current, power and/or energy, or other values. The computer system 106 may provide the adjustments and/or profile to the assembly 102 so that the assembly 102 can automatically adjust the voltage values measured by the voltage sensor. By provided the assembly 102 with calibration data of the type described above (such as profile data), the computer system 106 controls the assembly 102 such that the assembly 102 does not need to calibrate using the voltage meter 104 nearly as often, or at all. The assembly 102 may also be more accurate and reliable as a result of the computer system 106 providing a profile that accounts for the various issues mentioned above. The computer system 106 may generate the profiles and learn from the data using any machine learning methodology, such as reinforcement learning, neural networks, and so forth. However, the assembly 102 can calibrate to adjust the voltages measured by the voltage sensor based on input from the voltage meter 104 without input from the computer system 106.

Figure 2A:
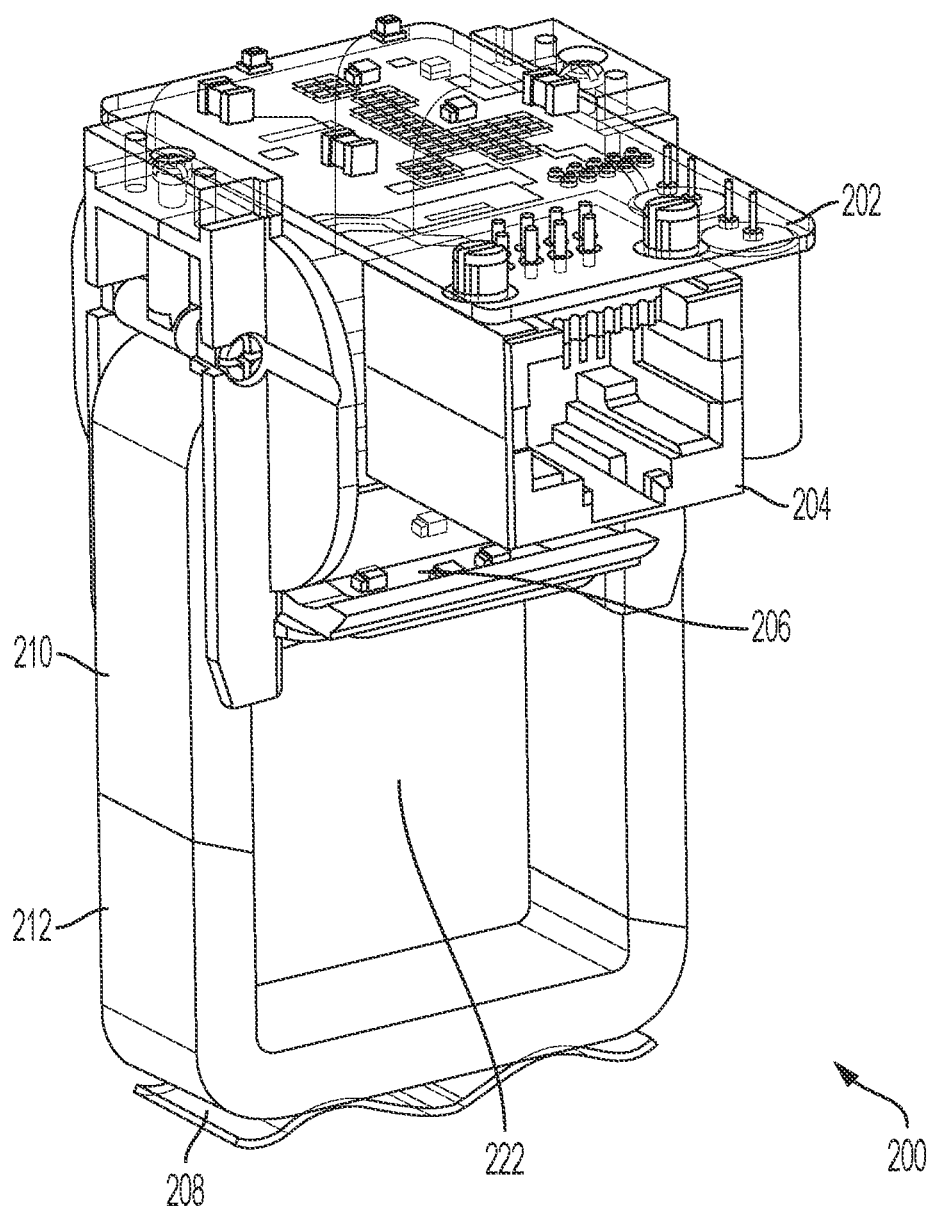
FIG. 2A illustrates an energy metering assembly according to an example.
Figure 2B:
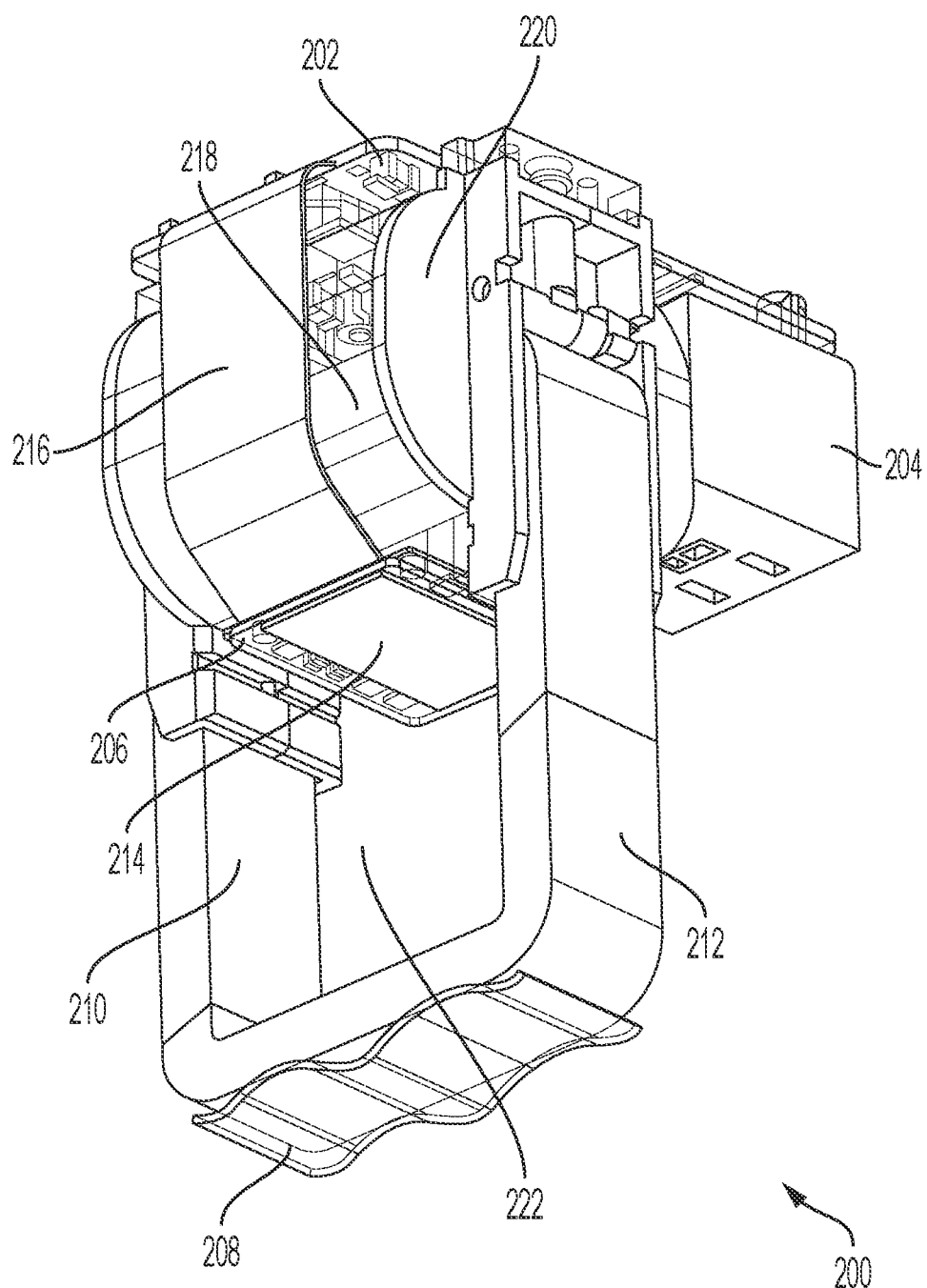
FIG. 2B illustrates the energy metering assembly from an opposite side compared to FIG. 2A, according to an example.

FIGS. 2A and 2B illustrate an energy metering assembly, generally indicated at 200, according to an example. In many examples, the assembly 200 is contained in an insulative shroud, such as plastic, rubber, or a dielectric material. However, FIGS. 2A and 2B do not show the shroud of the assembly 200. The shroud and its features will be discussed in greater detail with respect to FIGS. 3A-3C, 4, 5A and 5B, 7A-7C, 11A-11C, and elsewhere throughout this disclosure. FIG. 2A illustrates the assembly 200 from one side of the assembly. FIG. 2B illustrates the assembly 200 from an opposite side of the assembly. The assembly 200 includes a controller 202, a port 204 (also referred to as a "bidirectional coupling 204"), a voltage measurement circuit 206, a spring 208, a first core section 210, a second core section 212, a voltage sensor 214, a flexible connector 216 that may be a bus, wires, and/or a circuit, a secondary conductor 218, and a support 220. The assembly 200 may also include a shroud (not shown in FIGS. 2A and 2B).

The controller 202 is coupled to the port 204, support 220, and the flexible connector 216. The controller 202 may also be coupled to the shroud (not shown) to protect the controller. The flexible connector 216 is coupled to the voltage measurement circuit 206 and in some examples wraps around all or part of the support 220. The voltage measurement circuit 206 is coupled to the voltage sensor 214 and may be coupled to the support 220. The support 220 is coupled to the first core section 210. The first core section 210 is coupled to the secondary conductor 218 and to the second core section 212. In some examples, the first core section 210 is indirectly coupled to the second core section 212 via the shroud, a hinge, or another apparatus. The second core section is coupled to the spring 208, and both the spring 208 and second core section 212 are coupled to the shroud. As will be described in greater detail below, the spring 208 secures the assembly in place within the shroud.

The controller 202 is configured to transmit and receive data, such as transmitting data to and receiving data from the computer system 106 or voltage meter 104. The port 204 is an interface for the controller 202 to transmit information via a wired connection, though the controller 202 may also contain circuitry for wireless transmission of data. The port 204 receives power from an external power source (such as the voltage source 108, a battery, a generator, or the like—in preferred embodiments, power is provisioned from the voltage meter 104 via the port 204), provides power to other parts of the assembly 200, including the controller 202, voltage sensor 214, voltage measurement circuit 206, and so forth. The controller 202 may have power control circuitry for handling power received via the port 204, such as a switch mode buck/boost converter to produce other required voltage levels not provided directly by the port 204. The controller 202 also includes a temperature sensor configured to sense the ambient temperature around the assembly 200. In various examples, the controller 202 includes LED lights or similar devices to indicate the status of the controller 202 and/or assembly 200 as a whole. The controller 202 communicates with the voltage measurement circuit 206 via the flexible connector 216. In some examples, the controller 202 and voltage measurement circuit 206 communicate using only analog signals—that is, without using digital communications. In many examples, the voltage measurement circuit 206 provides analog signals indicative of the voltage sensed by the voltage sensor 214 or based on the voltage sensed by the voltage sensor 214 to the controller 202. In some examples, the voltage measurement circuit 206 also provides analog signal buffering of sensor readings provided by the voltage sensor 214, and may also offer transient protection of the controller 202 and/or other parts of the assembly 200, or provide electrical isolation of the voltage sensor 214 from other parts of the assembly 200.

The controller 202 provides calibration and correction to voltage measurements performed by the voltage sensor 214 or voltage measurement circuit 206. In some examples, data—including voltage data—is transmitted from the voltage measurement circuit 206 or voltage sensor 214 to the controller 202 via the flexible connector 216. In some examples, the controller 202 receives voltage measurements from another device, such as the voltage meter 104. The controller 202 may treat the values provided by the voltage meter 104 as "true." That is to say, the controller 202 may treat values provided by the voltage meter 104 as more accurately reflecting the true voltage provided to the loads 110 compared to the voltage measured by the voltage sensor 214. In some examples, there may be more than one voltage phase (e.g., a 3-phase power system). In multi-phase examples, multiple voltage meters may be used, with each respective voltage meter 104 corresponding to a specific phase of the power provided to the load. For example, in a 3-phase power system, there would be three voltage meters. In many examples, each voltage meter 104 will be located at the same general physical location, such as the same equipment panel.

The controller 202 calibrates and alters the voltage measurements of the voltage sensor 214 based on the "true" voltage measurements received from the voltage meter 104. In some examples, the controller 202 performs calibration and/or adjustment of the voltage measurements periodically, e.g., once every second, minute, hour, day, and so forth, whereas the voltages sensed by the voltage sensor 214 are used in real time and are collected continuously and/or at a high enough frequency to reflect real-time conditions. In some examples, the controller 202 adjusts future measurements from the voltage sensor 214 and/or voltage measurement circuit 206 based on the most recently received voltage values from the voltage meter 104 and/or on other information, such as temperature measurements from any temperature sensor discussed herein (e.g., the temperature sensor of the controller 202 or the temperature sensor of the voltage measurement circuit 206). The controller 202 may also be configured to create a model of voltages based on ambient conditions (temperature, position, etc.) of the assembly 200 and historical data. For example, the controller 202 may compare the temperature of the one or more primary conductors and the ambient temperatures normalized with and/or against the current flow of the one or more primary conductors with historical and/or present temperature data of the temperature of the one or more primary conductors and/or ambient temperature data, said temperature data being normalized with and/or against the current flow of the primary conductor. Significant variations—such as large changes in temperature of the one or more primary conductors—may indicate a fault.

In some examples, the computer system 106 uses machine learning algorithms and methods to build a model of voltages for the assembly 200, and the controller 202 uses said model, methods, or data to further modify voltages measured by the voltage sensor 214. In general, the controller 202 uses the methods and data described above to adjust the voltage measurements of the voltage sensor 214 to more accurately reflect the actual voltage received by the loads. In some examples, once the voltage sensor 214 is calibrated with zero current flow in the system (i.e., the load is off), the differences between the voltage sensor 214 measurements and the voltage meter 104 measurements can be used to assess the health of the distribution system (e.g., the power distribution system) by, for example, looking for abnormal voltage drops with respect to current, abnormal voltage and/or current drawn by a load, and other characteristics of the system that can be derived from or inferred via current and/or voltage measurements and comparisons. Calibration with zero load can be repeated periodically as required or on demand.

The controller 202 receives current measurements based on the secondary conductor 218 or core sections 210, 212. For example, the assembly 200 may function as a current transformer. The assembly 200 may be placed around a conductor (such as a wire or cable) carrying a voltage. For clarity, the wire or cable will be referred to as a primary conductor. In some examples, the assembly 200 is positioned such that the primary conductor passes through an aperture 222 within the core sections 210, 212. Alternating current in the primary conductor induces a current in the secondary conductor 218. The induced current in the secondary conductor 218 is related to the current in the primary conductor by the characteristics of the core sections 210, 212 and the number of turns of the secondary conductor 218. The controller 202 uses the relationship between the induced current and the current in the primary conductor to calculate the current in the primary conductor. That is, the controller 202 may relate the current in the primary conductor to the induced current in the secondary conductor using an equation such as Eq. 1 (below). The controller 202 uses the current determined to be in the primary conductor and the adjusted voltage value sensed by the voltage sensor and modified by the controller 202 to calculate the power and/or energy being used by the loads 110. In some examples, the controller 202 applies calibration data to the induced current signal on the secondary conductor 218 to account for ratio and phase errors arising from the non-ideal characteristics of various components of the assembly 200. Non-ideal characteristics may include various non-ideal characteristics of the core sections 210, 212, resistance in the conductors (e.g., internal resistance), and other effects.

In some examples, the controller 202 receives temperature information from both the temperature sensor 214 and the built-in temperature sensor of the controller 202 itself. The controller 202 can measure the ambient temperature with the built-in temperature sensor and can measure the temperature of the primary conductor, the secondary conductor 218, and so forth with the temperature sensor 214. The controller 202 can correlate the temperature of the primary conductor and the ambient temperature (and the difference between the temperature of the primary conductor and the ambient temperature) with measured current for normal situations (e.g., normal operation). By learning the correlation between temperature, current, voltage, and other features of the system, and tracking them overtime, the controller 202 can determine if a change in temperature is abnormal (e.g., higher or faster than expected), which would be an early indicator of potential overheating, risk of fire, or equipment damage. If the controller 202 determine that there is a risk of overheating, fire, or equipment damage, the controller 202 can provide a signal indicating the risk to a user, fire suppression system, equipment control system, or other device and/or person who can then take action.

The controller 202 may calculate a characteristic impedance of an electrical and/or power distribution system. In some examples, the controller 202 calculates the characteristic impedance of the electrical distribution system between the voltage meter (e.g., voltage meter 104) and the assembly 200. For example, if the voltage meter 104 is located at one position of the primary conductor (or primary conductors), and the assembly 200 is located at a different position, the controller 202 may determine the characteristic impedance of the primary conductor between the voltage meter 104 and the controller 202. In some examples, the controller 202 compares the voltage measured at the voltage meter 104 to the voltage measured at the controller 202, and may also measure the current in the primary conductor, and can derive the impedance of the primary conductor based on this information. The controller 202 may maintain a record (e.g., a database in memory or storage) of the impedance of the electrical system (e.g., the primary conductor) over time to determine a characteristic impedance of the electrical distribution system. The controller 202 can monitor the instantaneous impedance of the electrical distribution system and compare it to the characteristic impedance, and if the instantaneous impedance varies away from the characteristic impedance by a threshold impedance amount, the controller 202 can generate an alarm. In some instances, deviations in the impedance between the voltage meter 104 and the assembly 200 (or any other two points in the electrical distribution system) may be indicative of an abnormal heating of the electrical distribution system, such as abnormal heating of the primary conductor. Abnormal heating, in turn, can indicate damage, faults, or other conditions requiring remediation.

The controller 202 may provide the current, voltage, and power and/or energy information to the voltage meter 104 or computer system 106. In some examples, the controller 202 may also provide the information it collects and calculates to other assemblies 200.

The core sections 210, 212 form a core for the assembly 200. The core sections 210, 212 act as the core of a current transformer for the assembly 200. The core sections 210, 212 have various attributes. For example, it is preferable that the core sections 210, 212 originate from a single piece core. That is, both sections 210, 212 are part of the same core prior to being separated into a first core section 210 and a second core section 212. The core sections 210, 212 may be separated from one another by a cut. The cut may be horizontal or diagonal, though a diagonal cut is preferred. In FIGS. 2A and 2B the cut shown is diagonal. The second core section 212 is coupled to the shroud (not shown) such that the second core section 212 pivots on an axis relative to the first core section 210. In some examples, the second core section 212 pivots between an open and closed position. In the open position, the assembly 200 admits a wire, such as the primary conductor, and thus may be placed around the primary conductor such that the primary conductor passes through the aperture 222. In the closed position, the assembly 200 is locked or closed around the primary conductor, such that the primary conductor passes through the aperture 222.

In some examples, multiple primary conductors may pass through the aperture 222. That is, two conductors, three conductors, or any other number of conductors may pass through the aperture 222. For example, at high current levels, it is not uncommon for there to be two or three conductors passing through the aperture 222.

A portion of the first core section 210 may pass through the support 220. The portion of the first core section 210 passing through the support 220 is positioned between the controller 202 and the voltage measurement circuit 206 or voltage sensor 214. The secondary conductor 218 may be a winding (for example, the secondary winding) coiled around the portion of the first core section 210 that passes through the support 220. In some examples, the secondary conductor 218 is also coiled around other portions of the first or second core sections 210, 212. For example, the secondary conductor 218 may be coiled around the entirety of the first and second core sections 210, 212 to improve range and accuracy, or the secondary conductor 218 may be coiled around select portions of the core sections 210, 212 to meet performance targets and budget targets.

As mentioned, in some examples the second core section 212 is in contact with the spring 208. The spring 208 will be discussed in greater detail with respect to FIGS. 10A and 10B. The spring 208 is configured to hold the second core section 212 flush against the first core section 210 regardless of misalignments between the core sections 210, 212 or tolerances between the core sections and the shroud.

The voltage measurement circuit 206 is coupled to the voltage sensor 214 and may communicate with the controller 202. The voltage measurement circuit 206 may include a temperature sensor configured to measure a temperature of any of the voltage sensor 214, primary conductor, secondary conductor 218, core sections 210, 212, aperture 222, and so forth. The voltage measurement circuit 206 receives voltage measurements from the voltage sensor 214. The voltage measurement circuit 206 provides analog signals to the controller 202. The voltage measurement circuit 206, in some examples, also provides analog signal buffering of sensor readings provided by the voltage sensor 214, and may also offer transient protection of the controller 202 and/or other parts of the assembly 200, or provide electrical isolation of the voltage sensor 214 from other parts of the assembly 200.

The voltage sensor 214 is a non-contact voltage sensor. In some examples, this means the voltage sensor 214 is galvanically isolated from the primary conductor, but may otherwise be in physical contact with the primary conductor. Since the voltage sensor 214 is a non-contact voltage sensor (e.g., a capacitive voltage sensor that determines voltage based on capacitance), the voltage sensor 214 may provide incorrect or inaccurate measurements due to changes in temperature, distance and position relative to the primary conductor, and so forth. In some examples, the aforementioned inaccuracies may be due to the temperature-dependent dielectric properties of the voltage sensor or by changes in sensor placement or orientation, as well as by the insulation of the primary conductor and the shroud and/or housing of the voltage sensor 214 itself. The controller 202 may use the temperature measurements from the temperature sensor of the voltage measurement circuit 206 and/or the controller 202 to correct for temperature variations, and therefore voltage inaccuracies, experienced by the voltage sensor 214. That is, since the measurements of the voltage sensor 214 may depend on temperature, the controller 202 may correct and/or adjust the measurements based on the effects of temperature.

The core sections 210, 212 may be made of ferromagnetic or ferrimagnetic materials. In some examples, the core sections 210, 212 are made of nano-crystalline material. Nano-crystalline material has many advantageous properties, such as high permeability, and being relatively cheaper than nickel and many other metals, such as magnetic metal alloys, making it desirable for use as a core. However, the core sections 210, 212 may also be composed of iron, nickel, magnetic metal alloys, and other materials.

Figure 3A:
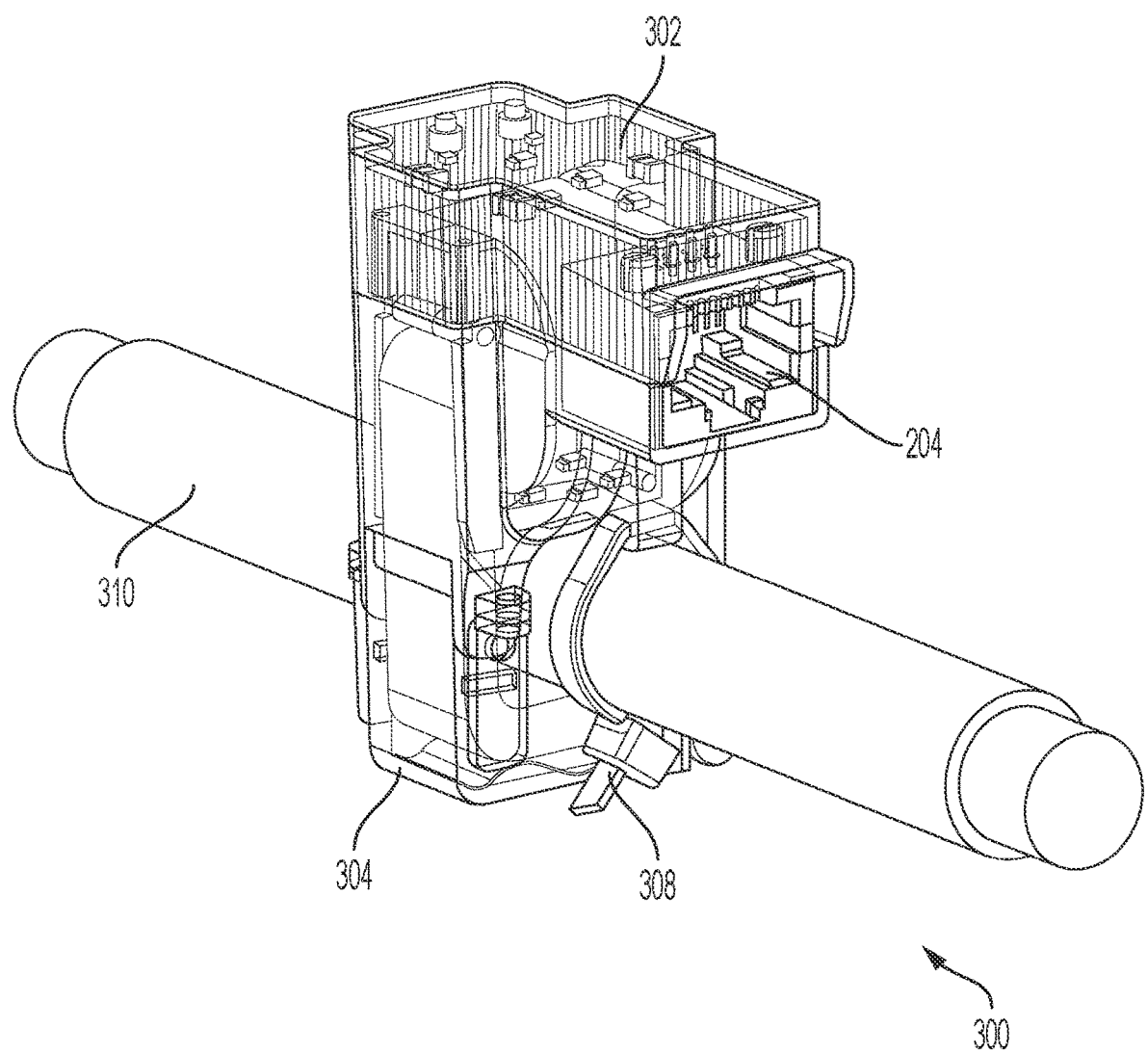
FIG. 3A illustrates the core of an assembly within a shroud in a closed position according to an example.
Figure 3B:
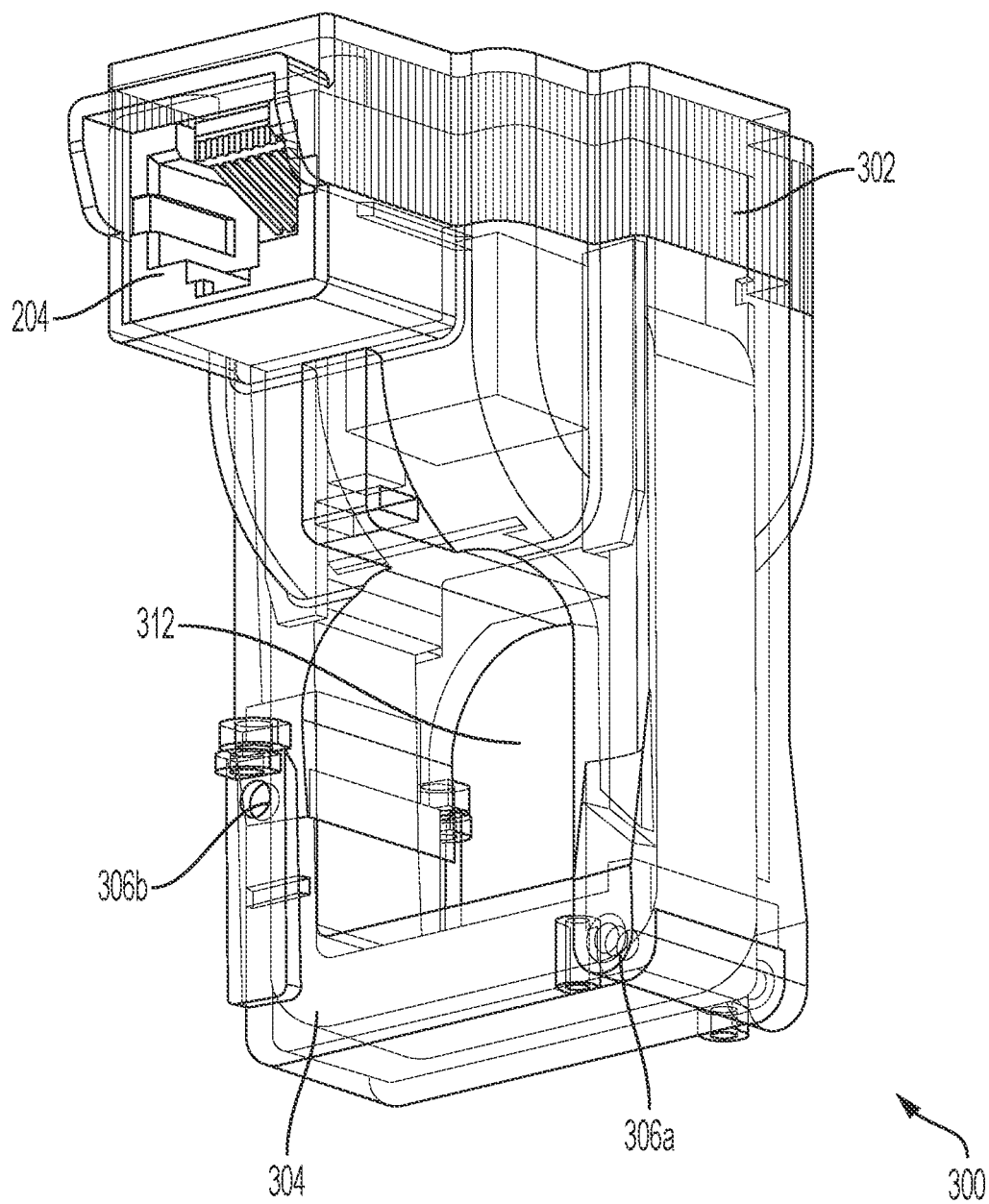
FIG. 3B illustrates the core of them assembly within a shroud in a closed position according to an example.
Figure 3C:
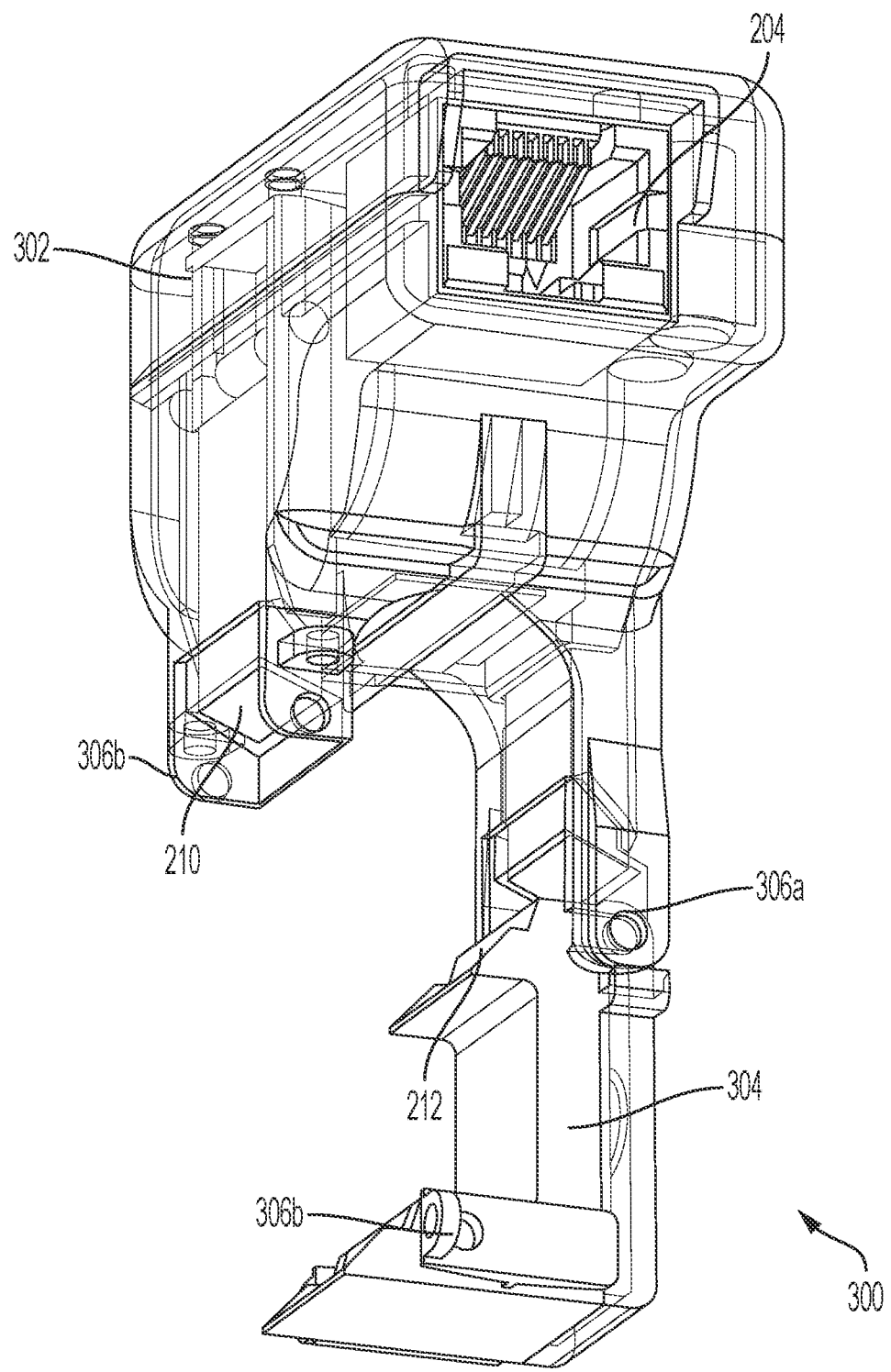
FIG. 3C illustrates the core of the assembly within a shroud in an open position according to an example.

FIGS. 3A, 3B, and 3C illustrate a shrouded assembly, generally indicated at 300, within a shroud. FIGS. 3A and 3B illustrates a core of the shrouded assembly 300 in a closed position, and FIG. 3C illustrates the core of the shrouded assembly 300 in an open position. The shrouded assembly 300 may, for example, be the assembly 200 of FIGS. 2A and 2B with a shroud around the components discussed in FIGS. 2A and 2B. For the purpose of clarity, where an internal portion of the shrouded assembly 300 is discussed, it will be referred to as though it were the assembly 200.

FIG. 3A illustrates a shrouded assembly 300 within a shroud in a closed position. The shrouded assembly 300 includes a first shroud section 302 and a second shroud section 304. A port 204 is shown within the first shroud section 302. Also shown is a zip tie 308 and a primary conductor 310. FIG. 3B illustrates the shrouded assembly 300 within the shroud in the closed position from a different angle than FIG. 3A. FIG. 3B further illustrates an aperture 312 through which the primary conductor 310 may pass. The aperture 312 may be the aperture 222 of FIGS. 2A and 2B with portions of the first shroud section 302 and second shroud section 304 occupying some of the space of the aperture 222. The shrouded assembly 300 may also include a pivot joint 306a and a latch portion 306b.

In the closed position shown in FIG. 3B, the first shroud section 302 surrounds or encompasses the controller 202, voltage measurement circuit 206, voltage sensor 214, flexible connector 216, support 220, and first core section 210, and so forth, and partially surrounds or encompasses the port 204. The second shroud section 304 surrounds or encompasses the second core section 212 and spring 208. In the open position shown in FIG. 3C, end portions of the core sections 210, 212 may be exposed to the open air outside the shroud.

The first shroud section 302 is coupled to the second shroud section 304. In some examples, the first shroud section 302 is coupled to the second shroud section 304 at the pivot point 306a. In some examples, the first shroud section 302 and second shroud section 304 may be held in the closed position by a latch 306b. The latch 306b may have a male portion and a female portion configured to receive the male portion. The male portion may be part of the second shroud section 304 and the female portion may be part of the first shroud section 302. Alternatively, the male portion may be part of the first shroud section 302 and the female portion may be part of the second shroud section 304.

In some examples, other latching or locking mechanisms may be used. For example, the pivot point 306a and latch 306b may be replaced by a pluggable connector, a flexible link, and so forth. In the case of a pluggable connector, for example, the second shroud section 304 may be configured to plug into the first shroud section 302 at points corresponding and/or approximately corresponding to the pivot point 306a and the latch 306b.

The first shroud section 302 may also be coupled to the zip tie 308. In some examples, the first shroud section 302 has a receptacle the zip tie 308 may be inserted through. In some examples, the receptacle for the zip tie is located on the second shroud section 304. Other methods may also be used to provide an additional point of contact, in addition to the latching and locking mechanisms discussed above, to secure the shrouded assembly 300 to the primary conductor. For example, hook and loop fastener material, a wire, a string, a rubber band, and/or an o-ring, and/or other similar devices may be used to secure the shrouded assembly 300 to the primary conductor.

The first shroud section 302 and second shroud section 304 are configured such that the first core section 210 and second core section 212 contact each other near the pivot 306a and latch 306b when the shrouded assembly 300 is in the closed position. As shown in FIG. 3C, the core sections 310, 312 may have one or more exposed ends not covered by the shroud sections 302, 304 when in the open position. The core sections 210, 212 contact each other when in the closed position such that the core forms a loop that completes the magnetic circuit. The shroud sections 302, 304 match the cut in the core sections 210, 212 such that the core sections 210, 212 form a magnetic circuit when in the closed position and the shroud sections 302, 304 have an approximately equivalent shape to the core sections 210, 212, thus fully encompassing the core sections 210, 212 in the closed position. The shroud sections 302, 304 may be configured such that the aperture 312 matches the gauge or shape of a primary conductor or wire, or may be configured to accommodate multiple wires. For example, the aperture 312 may be configured to securely hold a single wire of a given size and/or may be configured to securely hold wires of different sizes or to securely hold multiple wires.

In some examples, the shroud sections 302, 304 completely covers and insulates electrically conductive elements of the shrouded assembly 300 (e.g., assembly 200), preventing electrical shock due to contact with the shrouded assembly 300. In some examples, the shroud sections 302, 304 comply with standard UL-2808. The UL-2808 standard, and some other standards, demand specific construction methods for electrical devices to meet safety requirements. That is, in some examples, any transformer-related equipment (cores, secondary conductors, and so forth) contained within the shroud sections 302, 304 are fully insulated so that contact by a user with the transformer-related equipment will not or cannot occur. In some examples, the shroud may comply with other safety standards as well, such as UL601010-1, IEC61869-220, and so forth. The shroud may also be adjusted to comply with future safety standards, if needed.

Figure 4:
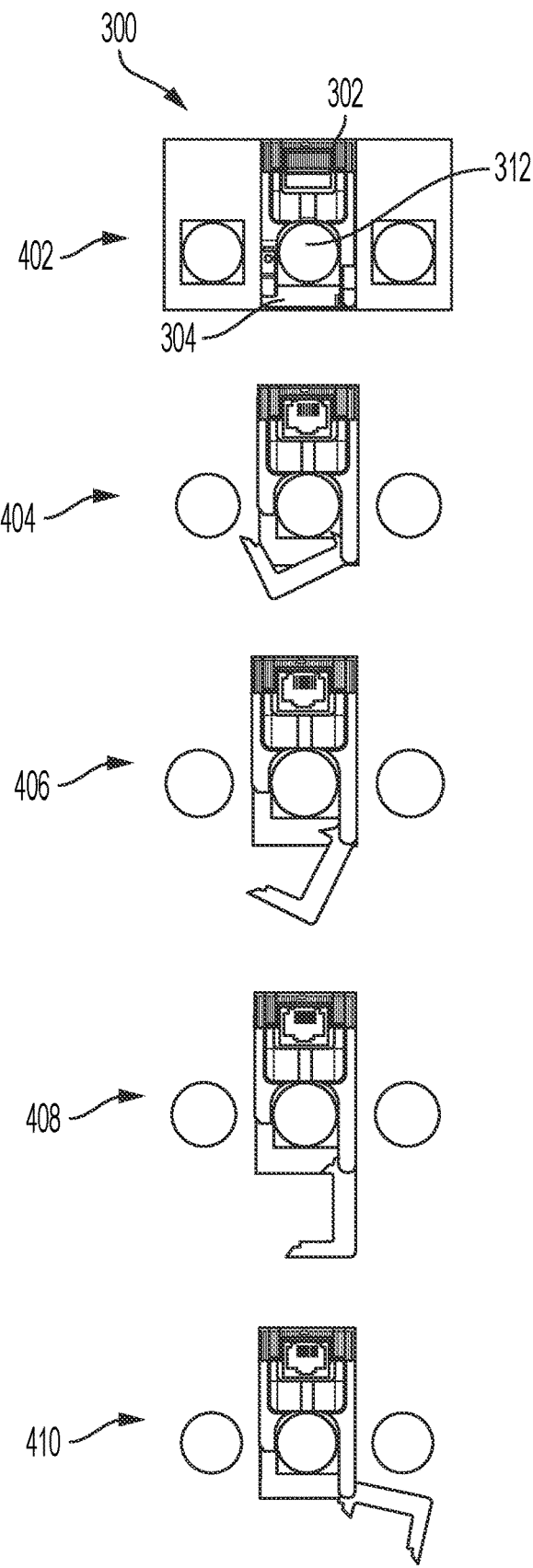
FIG. 4 illustrates how the sections of the shroud may pivot with respect to one another according to an example.

FIG. 4 illustrates how the second shroud section 304 pivots with respect to the first shroud section 302 according to an example. Components housed within the shroud sections 302, 304 may move in tandem with the shroud sections 302, 304.

Position 402 illustrates the shrouded assembly 300 in a closed position. The first shroud section 302 and second shroud section 304 are mated together, such that the latch 306b is engaged.

Positions 404, 406, 408, and 410 illustrates various open positions. Position 410 is a fully open position according to an example, while positions 404, 406, and 408 are intermediate open positions of the shroud. In the various open positions 404, 406, 408, 410 the shrouded assembly 300 may be able to receive or release one or more wires or primary conductors in the aperture 312. In the closed position 402, the shrouded assembly 300 may securely hold one or more wires within the aperture 312.

It will be appreciated that FIG. 4 illustrates a diagonally cut shroud and core, as will be discussed in greater detail with respect to FIGS. 5A and 5B.

Figure 5A:
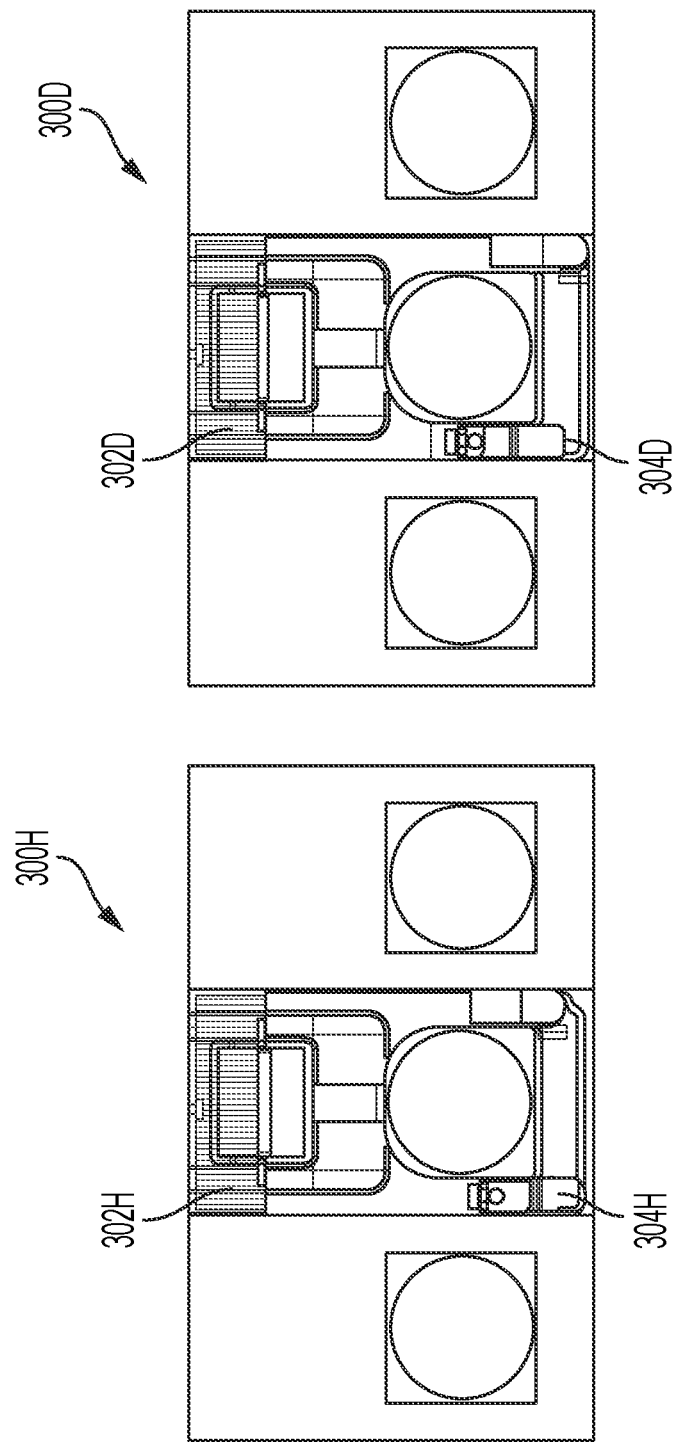
FIG. 5A illustrates shrouds and cores with horizontal and/or vertical cuts according to an example.
Figure 5B:
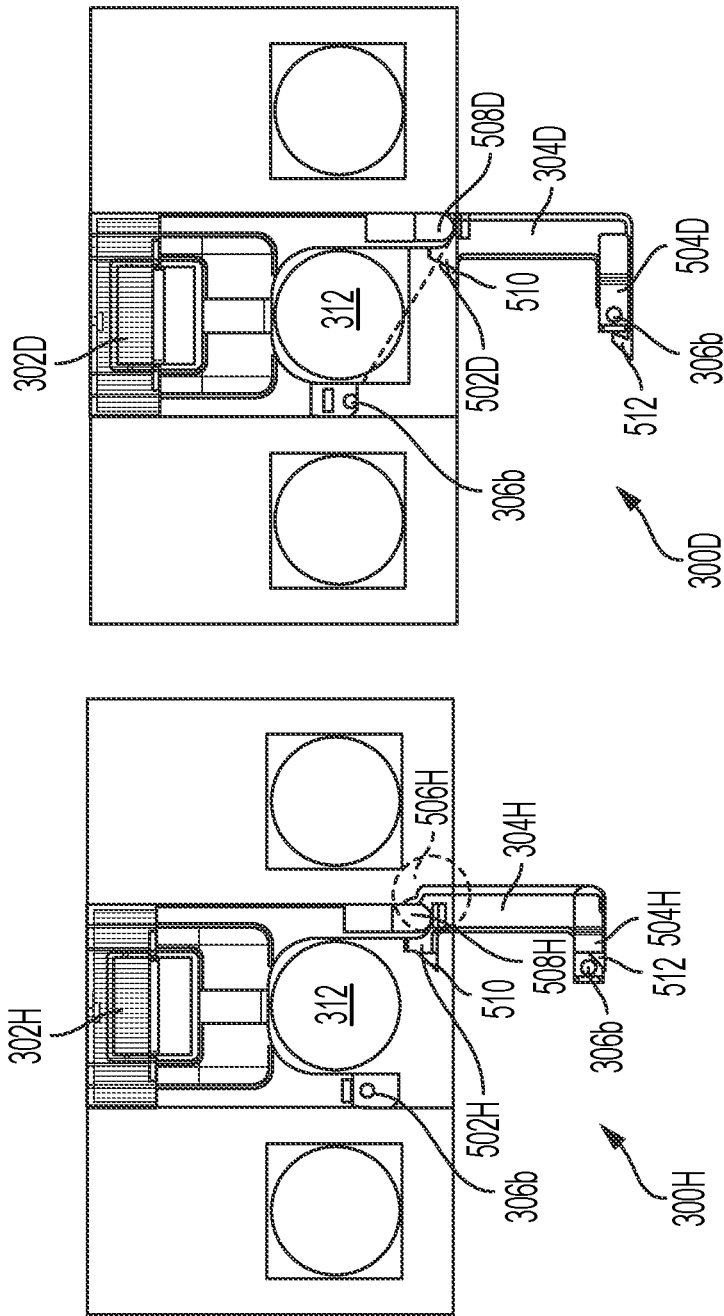
FIG. 5B illustrates shrouds and cores with horizontal and/or vertical cuts according to an example.

FIGS. 5A and 5B illustrate two shrouded assemblies 300H, 300D according to an example. The shrouded assembly 300H has a horizontally cut core and the shrouded assembly 300D has a diagonally cut core. In FIG. 5A, the shrouds 300H, 300D are in a closed position. In the closed position, both shrouds 300H, 300D have approximately the same profile and footprint, however the structure of the first and second shroud sections 302H, 302D, 304H, 304D are different. In the horizontally cut shrouded assembly 300H, the first core section 302H is shorter on the right side and longer on the left side compared to the first core section 302D of the diagonally cut shrouded assembly 300D. The second shroud portions 302D, 302H are approximately equally wide, however the diagonally cut second core section 302D of the shroud 300D is slightly longer on the left side.

FIG. 5B illustrates the shrouds 300H and 300D in an open position. It will be appreciated that the position shown is not necessarily a fully open position. Each second shroud section 304H, 304D has a respective first end 502H, 502D and second end 504H, 504D. The horizontal second shroud section 504H also has a dimple 506H. The dimple 506H allows the second shroud section 304H to fully open without interfering with the first shroud section 302H. The pivot joints 508H, 508D are also shown. Each first end 502H, 502D also has a plurality of mating features 510, 512. The mating features 510, 512 will be discussed in greater detail at FIGS. 8 and 9A-9C.

There are various differences between the respective shrouds 300H, 300D. The first end 502H of the horizontally cut shrouded assembly 300H has a flat cut relative to the diagonal cut of the first end 502D of the diagonally cut shrouded assembly 300D. The portion of the latch 306b coupled to the second shroud section 304H of the horizontally cut shrouded assembly 300H is further from the pivot joint 508H than the mating feature 512 compared to the diagonally cut shrouded assembly 300D. In the diagonally cut shrouded assembly 300D, the latch 306b is closer to the joint 508D than is the mating feature 512. The pivot joint 508H of the horizontally cut shrouded assembly 300H is also offset from the corner of the of the second shroud section 304H, such that the pivot joint 508H is coupled to the second shroud section 304H at approximately the middle of the first end 502H. By comparison, the pivot joint 508D of the diagonally cut shrouded assembly 300D is coupled to the second shroud portion 304D at approximately a corner of the second shroud section 304D. It will be appreciated that the diagonally cut topology of the diagonally cut shrouded assembly 300D provides greater access to the aperture 312 of the shrouded assembly 300D compared to the horizontally cut shrouded assembly 300H. In particular, the clearance provided by the diagonally cut shrouded assembly 300D compared to the horizontally cut shrouded assembly 300H is shown by the respective dotted lines running from the latch 306b to the respective pivot joints 508H, 508D. The dotted line, indicating the clearance provided, is longer with respect to the diagonally cut shrouded assembly 300D. In some examples, it may be easier to place a wire or primary conductor within the aperture 312 of the diagonally cut shrouded assembly 300D compared to the horizontally cut shrouded assembly 300H.

Figure 6A:
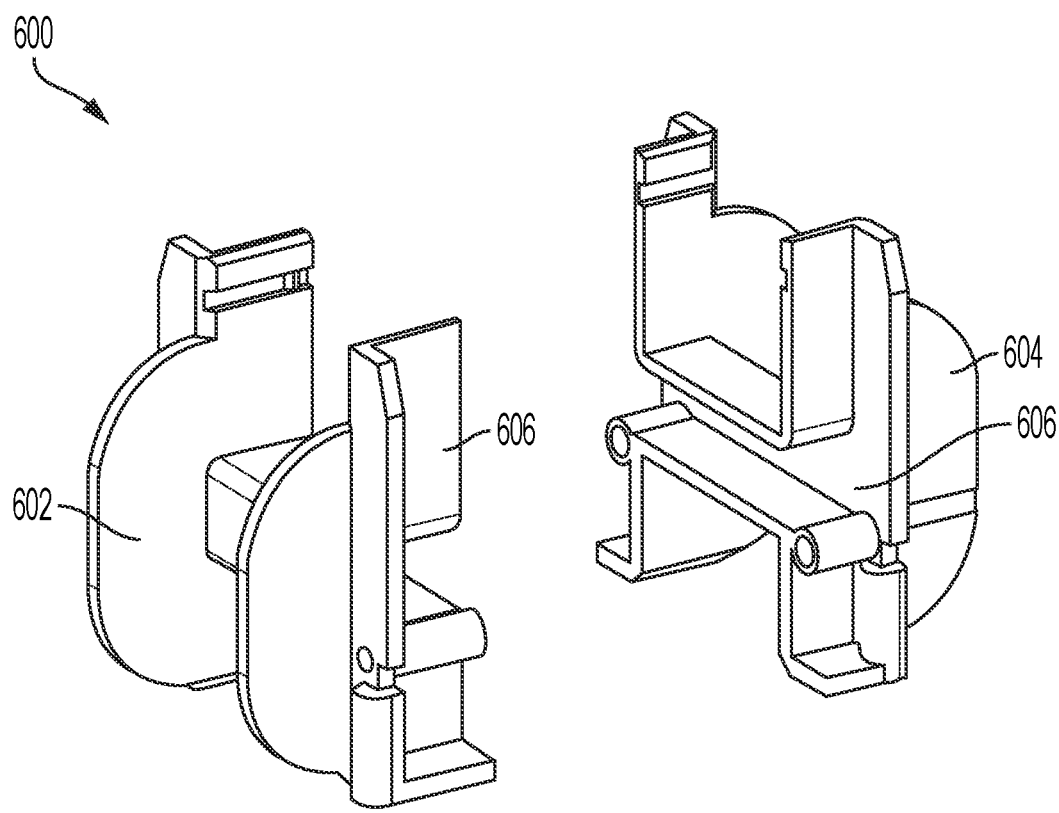
FIG. 6A illustrates an exploded view of a support according to an example.
Figure 6B:
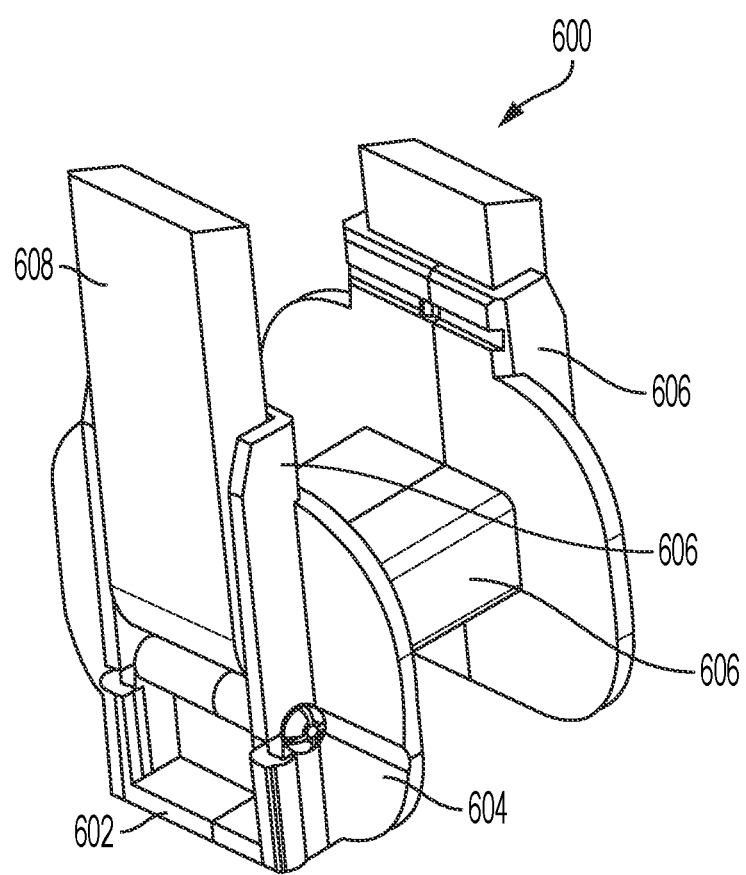
FIG. 6B illustrates the support with a core passing through it according to an example.

FIGS. 6A and 6B illustrate a support, generally indicated at 600, according to an example. The support 600 separates the core from other components of the assembly, including the secondary conductor in some examples. In some examples, the support 600 may be a bobbin.

FIG. 6A illustrates an exploded view of the support 600 according to an example. The support 600 may be located within the shrouded assembly 300, and is configured to separate the first core section 210 from other components contained within the shrouded assembly 300. In some examples, the secondary conductor may be within the support 600, and in other examples, the secondary conductor may be wound around the outside the support 600. In some examples, the support 600 will be located within the first shroud section 302. In some examples the support 600 is coupled to the shrouded assembly 300 or first shroud section 302. In some examples, the support 600 may serve as an example of the support 220 of FIGS. 2A, 2B, and 2C.

The support 600 includes a first half 602 and a second half 604. The first half 602 is coupled to the second half 604. In some examples, the first half 602 and second half 604 are substantially identical. In some examples, the first half 602 is slightly wider relative to the second half 604. When coupled together, the first half 602 and second half 604 form a channel 606.

The support halves 602, 604 may be coupled together in various ways. In some examples, the support halves 602, 604 are coupled together using ultrasonic welding, in various examples, the support halves 602, 604 are coupled together using snaps and/or locating pins, and in some examples the support halves 602, 604 are coupled together using other fasteners (screws, and so on). In some examples, the support 600 may be made via an injection mold. In some preferred embodiments, ultrasonic welding is used to couple the support halves 602, 604 together. In other preferred embodiments, snaps are used to couple the support halves 602, 604 together. In many embodiments, no screw or similar fastener is used.

FIG. 6B illustrates the support 600 with a core 608 going through the channel 606. As can be seen, when the two halves 602, 604 are coupled together, a channel 606 of the shape and size of the core 608 is formed. The channel 606 has three portions: two vertical portions are provided on either side of the support 600, and one horizontal portion (orthogonal to the vertical portions) is provided between the vertical portions. In some examples, the vertical portions of the channel 606 may only surround part of the core, such as two or three sides of the core. In some examples, the horizontal portion of the channel 606 surrounds at least four sides of the core. A coil, such as the secondary conductor, may be wrapped around the horizontal portion of the channel 606, on the outside of the channel, while the core 608 is within the inside of the horizontal portion of the channel 606. In some examples, the coil may be wrapped directly around the core 608. In some examples, other equipment, such as the controller, voltage sensor, or other elements of the assembly (e.g., assembly 200) are coupled to the outside of the support 600 as well.

Figure 7A:
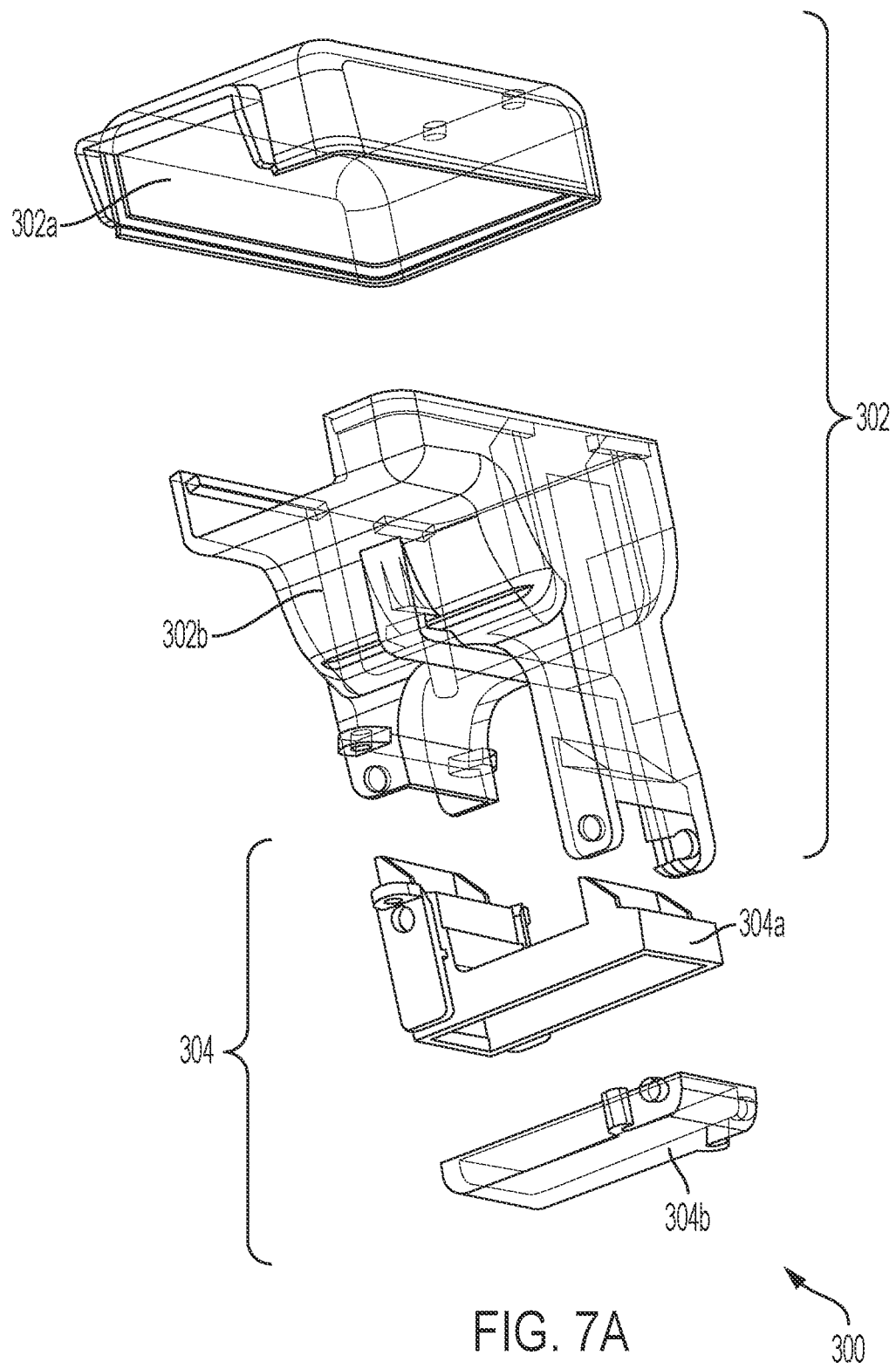
FIG. 7A illustrates an exploded view of a shroud according to an example.
Figure 7B:
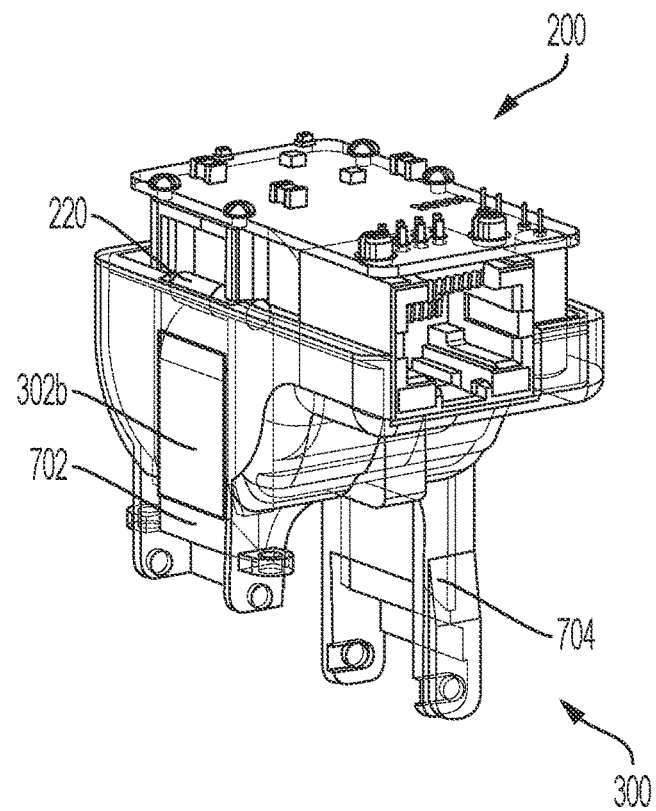
FIG. 7B illustrates a view of the body portion of the shroud with portions of an assembly fitted within it according to an example.
Figure 7C:
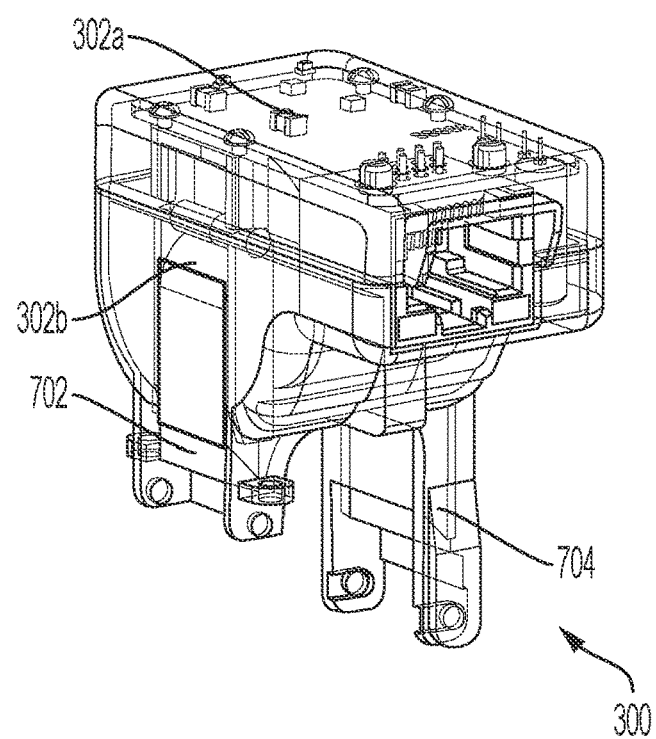
FIG. 7C illustrates a view of the shroud retaining the assembly according to an example.

FIGS. 7A, 7B, and 7C illustrate the shroud containing a portion of the assembly according to an example. FIG. 7A illustrates an exploded view of the shrouded assembly 300 according to an example. The shrouded assembly 300 includes the first shroud section 302 and the second shroud section 304. The first shroud section 302 may, in some examples, include a cap portion 302a and a body portion 302b. The second shroud section 304 may, in some examples, comprise an upper portion 304a and a lower portion 304b. The cap portion 302a may be coupled to the body portion 302b such that the cap portion 302a and body portion 302b are secured to one another. The upper portion 304a and lower portion 304b may be coupled to each other securely as well.

FIG. 7B illustrates a view of the body portion 302b of the first shroud section 302 with portions of the assembly 200 fitted within it, according to an example. FIG. 7C illustrates a view of the body portion 302b with portions of the assembly 200 fitted within it, and the cap portion 302a coupled to the body portion 302b. FIGS. 7B and 7C generally illustrate how portions of the assembly 200 may be secured within the shrouded assembly 300.

The upper portion of the assembly 200 fits within the body portion 302b. For example, one or more of the first core section 210, port 204, voltage sensor 214, controller 202, voltage measurement circuit 206, flexible connector 216, support 220, and secondary conductor 218 may be fully or partially enclosed within the body portion 302b and/or cap portion 302a. It will be observed that the ends of first core section 210 and the port 204 may be only partially enclosed by the shrouded assembly 300 when the assembly 200 is placed within the shrouded assembly 300.

The first shroud section 302 snuggly fits portions of the assembly 200. That is, when the portions of the assembly 200 are within the shrouded assembly 300, the portions of the assembly 200 may not move or travel at all, or may move or travel a small amount. The shrouded assembly 300 also offers protection and insulation for the assembly 200.

Referring to FIG. 7B, the shrouded assembly 300 may include two legs, a first leg 702 and a second leg 704. In some examples, the first leg 702 is shorter than the second leg 704. Portions of the first core section 210 may fit within the legs 702, 704. When combined with the support 220, the legs 702, 704 may form a channel for the first core section 210 that surrounds the core on every side except at the two ends of the core that are exposed to contact the ends of the second core section 212. In this manner, the first core section 210 is physically and/or electrically isolated from other electrical components of the circuit.

Figure 8:
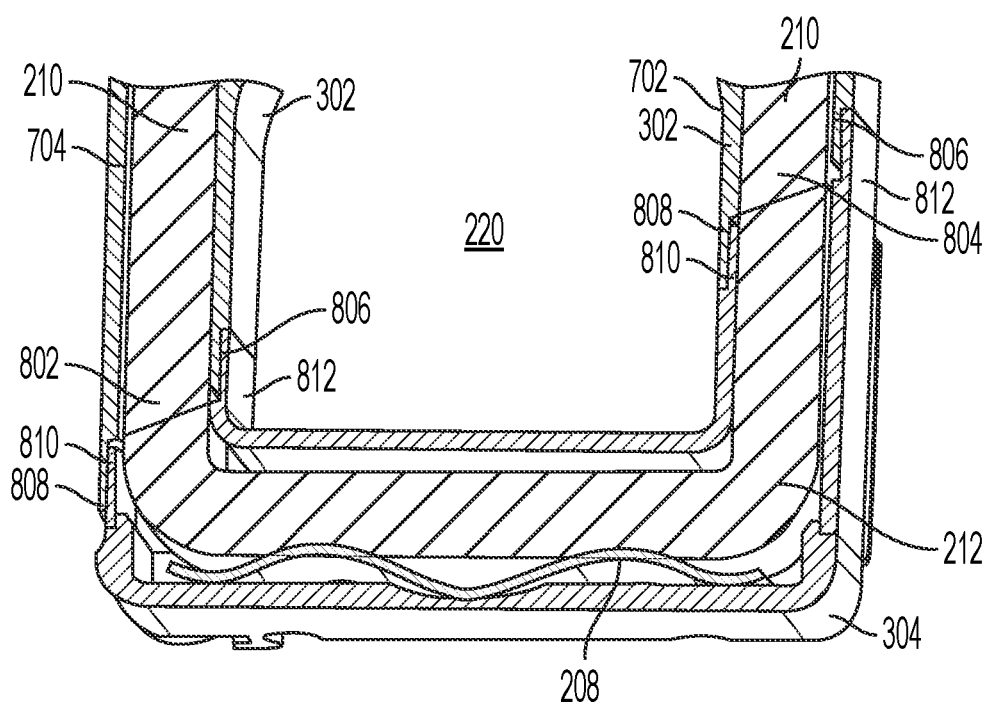
FIG. 8 illustrates a cross-section of the shroud, showing the core within it, according to an example.

FIG. 8 illustrates a cross section of the first and second shroud sections 302, 304 according to an example. The first core section 210 sits within the first shroud section 302. The second core section 212 sits within the second core section 304. The shroud sections 302, 304 and core section 210, 212 make contact at the joints 802, 804 when the assembly 200 is in the closed position. The spring 208 biases the second core section 212 into position so that the ends of the second core section engage ends of the first core section 210. Also shown are mating features, which may be examples of the mating features 510, 512 of FIGS. 5A and 5B. The mating features include inner mating features 806 for the first shroud section 302 and inner mating features 810 for the second shroud section 304, as well as outer mating features 808 for the first shroud section 302 and outer mating features 812 for the second shroud section 304. Also shown are the respective legs 702, 704 of the shrouded assembly 300.

The mating features 806, 808, 810, 812 are coupled to their respective shroud sections 302, 304, and are configured to hold the first shroud section 302 and second shroud section 304 together while minimizing travel or movement of the shroud sections 302, 304 with respect to one another. In some examples, the outer mating features 808 are configured to nest with the inner mating features 810, and the inner mating features 806 are configured to nest with the outer mating features 812.

The primary purpose of the shrouds or shroud sections 302, 304 is to provide electrical and/or physical isolation between the core (e.g., core sections 210, 212) and the primary conductor. Such electrical isolation is a safety requirement of the three standards mentioned with respect to FIGS. 3A, 3B, and 3C.

The mating features 806, 808, 810, 812 also prevent movement of the shroud sections 302, 304 by being asymmetrically arranged. For example, on the first leg 702, on the side of the first leg 702 adjacent to the aperture 220, the outer mating feature 808 of the first shroud section 302 is adjacent to inner mating feature 810 of the second shroud section 304 and to the aperture 220. On the opposite side of the first leg 702, further from the aperture, the inner mating feature 806 of the first shroud section 302 is adjacent to the outer mating feature 812 of the second core section 304 and to the first core section 210. With respect to the second leg 704, the outer mating feature 812 of the second shroud section 304 is adjacent to the aperture 220 and to the inner mating feature 806 of the first shroud section 302. The inner mating feature 810 of the second shroud section 304 is adjacent to the core and to the outer mating feature 808 of the first shroud section 302. Put another way, each shroud section 302, 304 has an outer mating feature 808, 812 adjacent to the aperture 220 and an inner mating feature 806, 810 adjacent to the core.

Figure 9C:
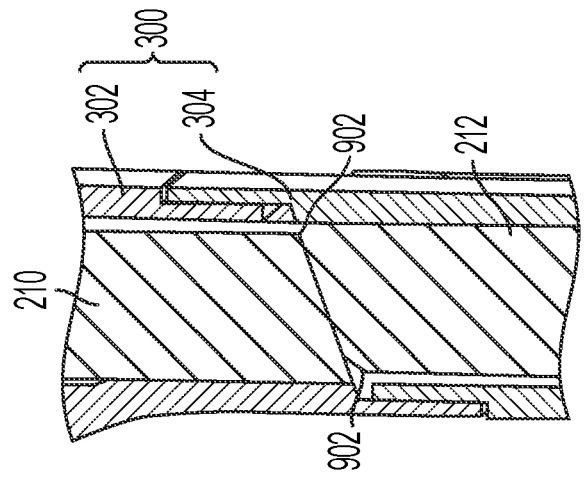
FIG. 9C illustrates the alignment of two sections of the core under non-ideal conditions with a chamfer applied, according to an example.
Figure 9B:
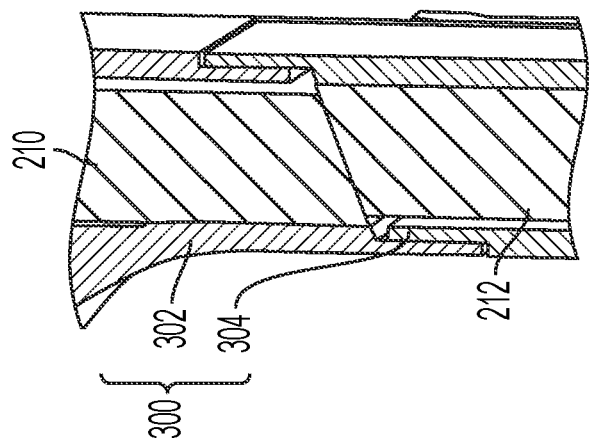
FIG. 9B illustrates the alignment of two sections of the core under non-ideal conditions according to an example.
Figure 9A:
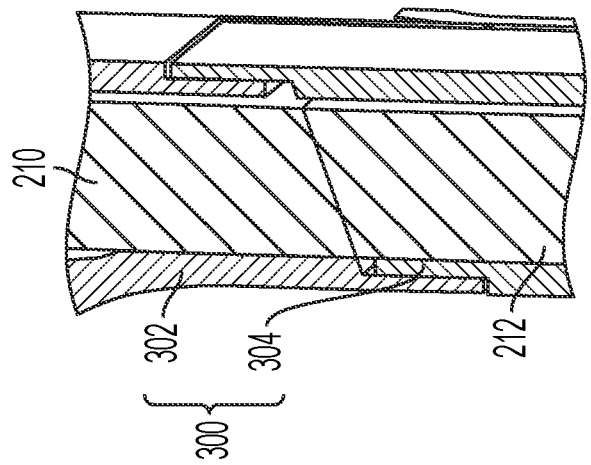
FIG. 9A illustrates the alignment of two sections of the core under ideal conditions according to an example.

FIGS. 9A, 9B, and 9C illustrate the core sections 210, 212 within the shrouded assembly 300 under different conditions according to an example. FIG. 9A illustrates the core sections 210, 212 under ideal conditions without a chamfer according to an example. Under ideal conditions, the first core section 210 and second core section 212 line up perfectly. The perfect alignment of the core sections 210, 212 offsets at least some reduction in the performance of the core due to cutting the core into two sections. The air gap between the two sections 210, 212 of the core is minimized or eliminated when the core sections 210, 212 are aligned in the closed position.

FIG. 9B illustrates the core sections 210, 212 under actual or realistic conditions without a chamfer according to an example. As can be seen, the core sections 210, 212 do not line up perfectly and there are portions of the core sections 210 hanging in the air. Because of travel within the shroud, manufacturing imperfections, and other issues, FIG. 9B illustrates a state of the core sections 210, 212 that can be expected to occur at least some of the time. The performance of the mis-aligned core sections 210, 212 without a chamfer is often worse than the perfectly aligned core sections of FIG. 9A due to the misalignment and the surface area of the ends of the core sections 210, 210 which are exposed to open air.

FIG. 9C illustrates the core sections 210, 212 with a chamfer 902 under actual or realistic conditions (i.e., not perfectly aligned) according to an example. In the example, the second core section 212 has a chamfer 902 on two sides. The chamfer 902 narrows the surface area of the portion of the core section 212 contacting the core section 210. The performance of the core sections 210, 212 in FIG. 9B and FIG. 9C are the same or approximately equal. The presence of the chamfer 902 changes the behavior of the core sections 210, 212 under actual or realistic conditions. In ordinary use, the misalignment of the core sections 210, 212 in FIG. 9B may vary depending on difficult to control factors. Thus, in FIG. 9B, the core sections 210, 212 can range from perfectly aligned under actual conditions to considerably misaligned. The varying range of possible alignments in FIG. 9B in turn means that, at any given moment, the alignment of the core sections 210, 212 can change to be relatively more or less aligned. The result of changing alignment is that the performance of the core sections 210, 212 can vary unpredictably. The chamfer 902 addresses the issue of unpredictable alignments. With the chamfer 902, the core sections 210, 212 can shift in actual operation without changing the total surface area of the core sections 210, 212 in contact with one another. For example, a chamfer 902 with a width of 0.3 mm accommodates the core sections 210, 212 shifting by up to 0.3 mm in any cardinal direction relative to dead center without resulting in a change in the surface area of the core sections 210, 212 in contact with each other. By accommodating some travel of the core sections 210, 212, consistent performance is achieved by ensuring the same surface area is always (or almost always) in contact between the core sections 210, 212 despite any misalignment.

The chamfer 902 may be cut at any angle, such as 35 degrees, 45 degrees, 55 degrees, and so forth. The chamfer 902 may be any width as well, for example, 0.3 millimeters (mm), 0.4 mm, 0.5 mm, 0.7 mm, 1 mm, and so forth. The chamfer 902 may be on any number of the sides of the core section. For example, the chamfer 902 as illustrated is on two sides of the second core section 212, but it could be on all sides, one side, three sides, and so forth. In preferred embodiments, the chamfer is on four and/or all sides. In some examples, the chamfer 902 will be on only one of the core sections 210, 212, however, the chamfer may be on either the first core section 210 or the second core section 212. In some examples the chamfer 902 may be on both core section 210, 212. For example, the chamfer 902 may be on the first core section 210 in the first leg 702 and on the second core section 212 on the second leg 704. Preferentially, there will be only one chamfer 902 per leg 702, 704. The chamfer 902 may reduce the cross-sectional area on one core section (e.g., the second core section 212) that contacts the other core section (e.g., the first core section 210). The percentage reduction in surface area in contact may be any amount, including 25%, 40%, 50%, 60%, 68%, 75%, and so forth. The presence of the chamfer ensures consistent performance over a range of misalignments, which allows for easier calibration of the assembly 200.

In addition to including a chamfer 902, the core sections 210, 212 may be lapped to make the surface perfectly flat or as near to perfectly flat as practically possible. The combination of being lapped and having a chamfer 902 may significantly improve the performance of the core, including the magnetic performance of the core, compared to an unlapped core. For example, an unlapped, split (or cut) core with a fixed number of secondary turns may have approximately 11 mH inductance and 440 Ohm (Ω) parallel equivalent resistance. A lapped, split core may have approximately 25 mH, 460Ω. A lapped split core with perfect alignment (i.e., a cut core, split into a first section and a second section with the characteristics of FIG. 9A) may have approximately 65% the inductance of the original, and comparable resistance, for example, 17 mH and 445Ω. A lapped split core under non-ideal conditions (i.e., a slight offset) with a chamfer 902 (i.e., a split core as shown in FIG. 9C) may have 16 mH and 400Ω. Even a lapped split core with a chamfer 902 and a substantial offset may still provide 15 mH and close to 400 Ω resistance. Actual values may vary in practical application. However, as these comparisons indicate, the chamfer 902 and lapping of the split core (e.g., core section 210, 212) substantially improve the consistency of the magnetic characteristics of the core sections 210, 212 compared to a standard, unlapped, cut core.

The above comparisons of inductance and resistance were measured under constant conditions by providing a fixed number of turns and an AC signal of fixed voltage and frequency, with no additional clamping force applied to the split core sections.

Figure 10A:
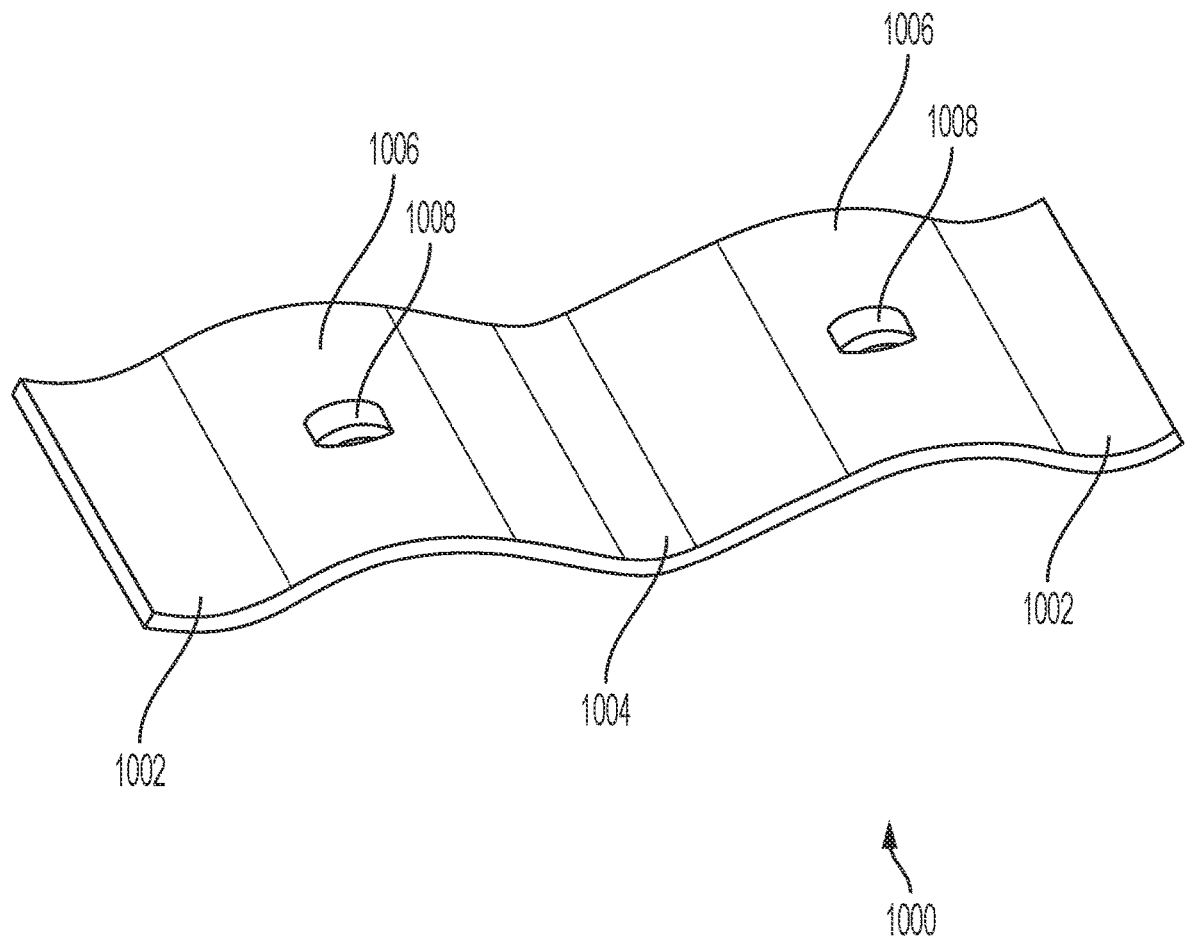
FIG. 10A illustrates a spring according to an example.
Figure 10B:
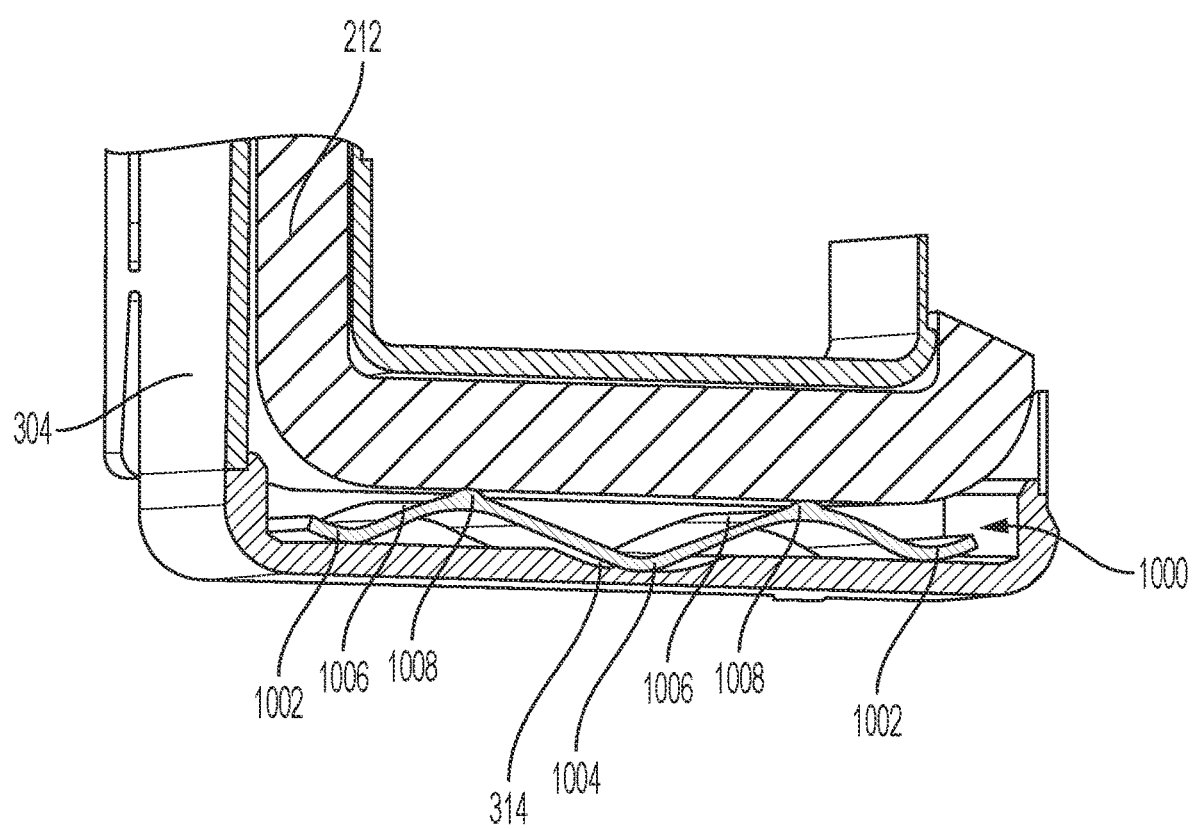
FIG. 10B illustrates the spring positioned within the shroud to bias a core section according to an example.

FIGS. 10A and 10B illustrate a spring, generally indicated at 1000, according to an example. FIG. 10A illustrates the spring 1000 according to an example. The spring 1000 biases the second core section 212 in a position that maximizes contact between the two core sections 210, 212 when the shrouded assembly 300 is in the closed position. That is, the air gap between the exposed ends of the core sections 210, 212 is minimized and the surface area of the exposed ends of the core sections 210, 212 is minimized in the closed position compared to an assembly or shroud that lacked the spring 1000.

The spring 1000 includes two lateral minima, each indicated at 1002, and a central minimum 1004. The spring 1000 includes two maxima, each indicated at 1006, and two dimples, each indicated at 1008. The central minimum 1004 is located in the center of the spring 1000 and may be a lower minimum compared to the lateral minima 1002. For example, the central minimum 1004 may sit in a groove 314 below the other minima 1002 (as shown in FIG. 10B). The purpose of the central minimum 1004 sitting in the groove 314 lower than the lateral minima 1002 is to maintain the position of the spring 1000 even while the spring 1000 deforms and moves in operation. The dimples 1008 may be located on the maxima 1006. The dimples 1008 may be rounded, semi-circular, hemispherical, and so forth. The dimples 1008 may be located anywhere along the maxima 1006 of the spring 1000. However, in some examples, the dimples 1008 will be located along the centerline of the spring 1000.

FIG. 10B illustrates the spring 1000 biasing the second core section 212 according to an example. The spring 1000 sits in the base of the second shroud section 304. The central minimum 1004 sits in a cavity 314 in the base of the second shroud section 304. The wavelike structure of the spring 1000 causes the spring to apply force on the second core section 212 at two points corresponding to the dimples 1008. The force biases the second core section 212 upward so that the second core section 212 contacts the first core section 210. The dimples 1008, are the points of contact at which the spring 1000 contacts the second core section 212. By acting as point contacts for the core section 212, the hemispherical (or otherwise rounded) dimples 1008 allow the second core section 212 to tilt in in one direction, on one axis of rotation, and/or side-to-side. Without the dimples 1008, or an equivalent structure, the second core section 212 would be pressed evenly upward. If the core is a split core with a cut, which may generally not be perfectly perpendicular to the upward direction of travel, the spring 1000 would produce uneven pressure on the second core section 212, the uneven pressure resulting in an air gap on one side where the second core section 212 contacts the first core section 210. More particularly, in some examples, one section of the core will tilt away from the other section of the core creating an air gap that impact performance. The dimples 1008 account for the uneven pressure exerted on the second core section 212 by the spring 1000 by acting as single points of contact around which the second core section 212 can tilt. The dimples 1008 therefore allow the second core section 212 to contact the first core section 210 without creating an air gap that would impact performance of the core. In this way, the dimples 1008 allow even pressure to be applied by the spring 1000 to the second core section 212.

In some examples, the dimples allow the second core section 212 the freedom to tilt slightly with respect to the first core section 210. This allows even pressure between the surface upon which the core sections contact each other. The even pressure ensures there are no potential air gaps between the core surfaces, even when the cut on the second core section 212 is not perfectly parallel with respect to the cut on the first core section 210.

In some examples, the spring 1000 may have only a single dimple 1008 on a single maximum 1006. In other examples, the spring 1000 may have more than one dimple 1008 on more than one maxima 1006. Other types of spring may also be used, for example, coil springs or other spring geometries that bias the core to eliminate the air gap between the core sections. In some examples, only a single point of contact (i.e., a single dimple) between the spring 1000 and the second core section 212 is needed.

Figure 11A:
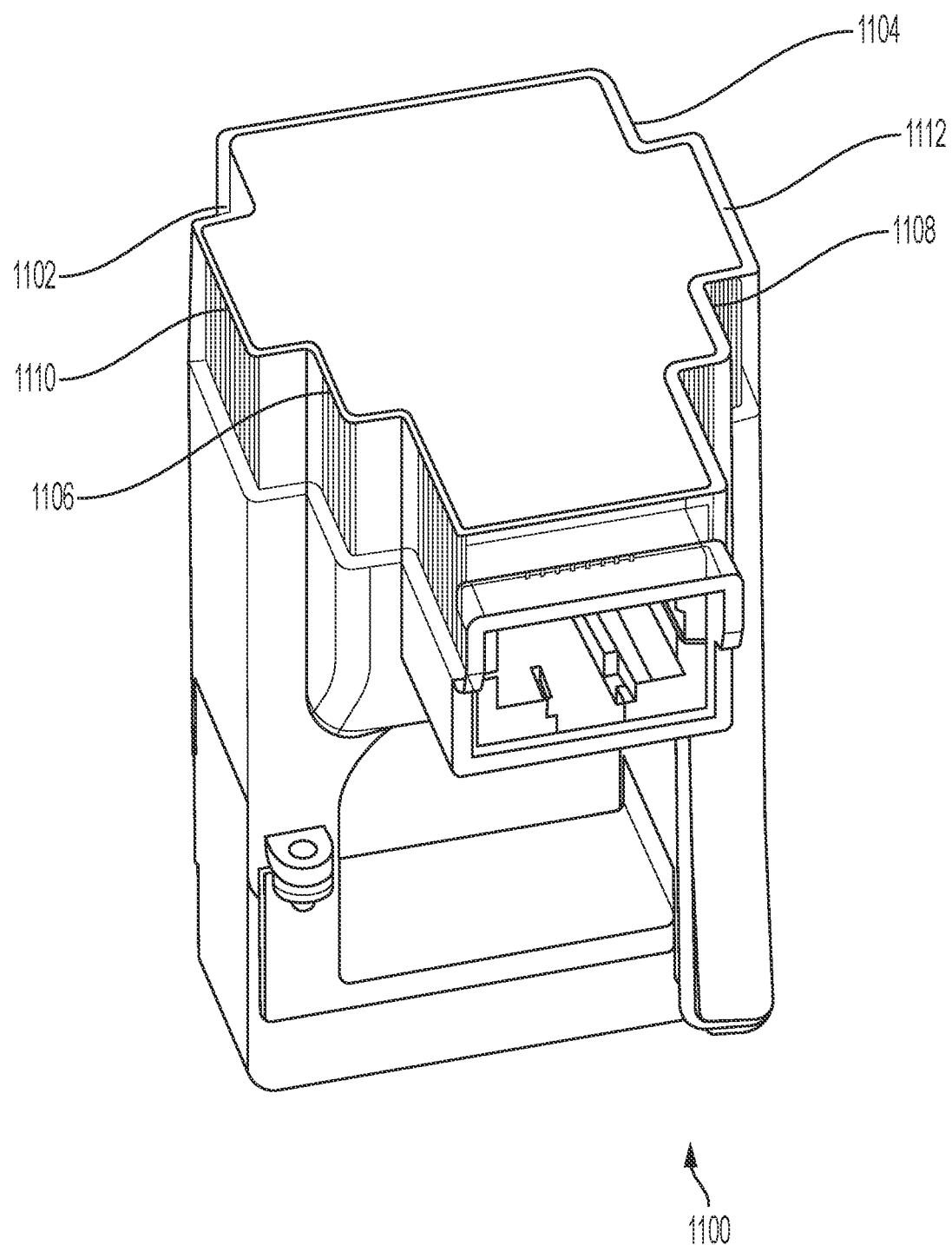
FIG. 11A illustrates an assembly according to an example.
Figure 11B:
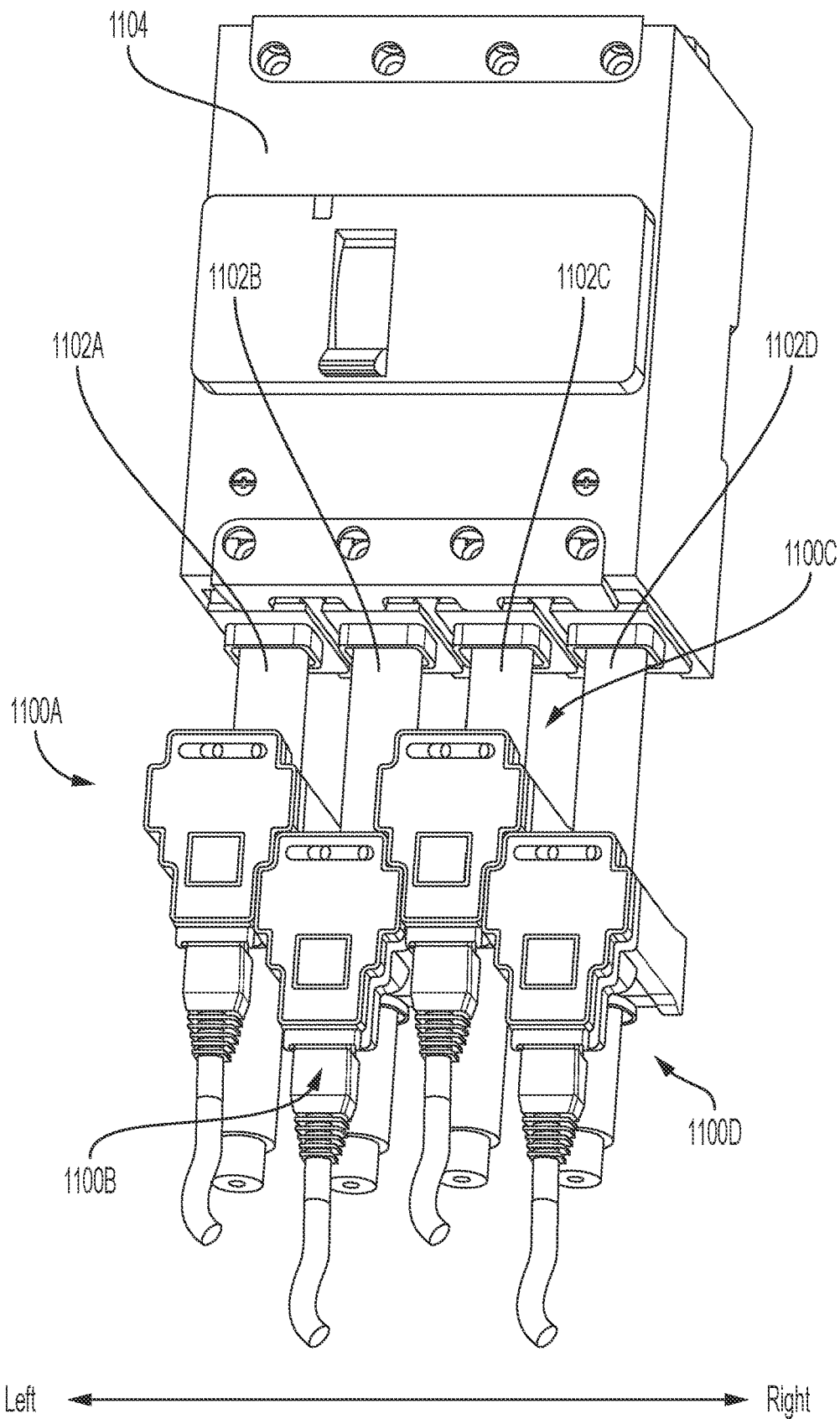
FIG. 11B illustrates assemblies nested in a staggered manner according to an example.
Figure 11C:
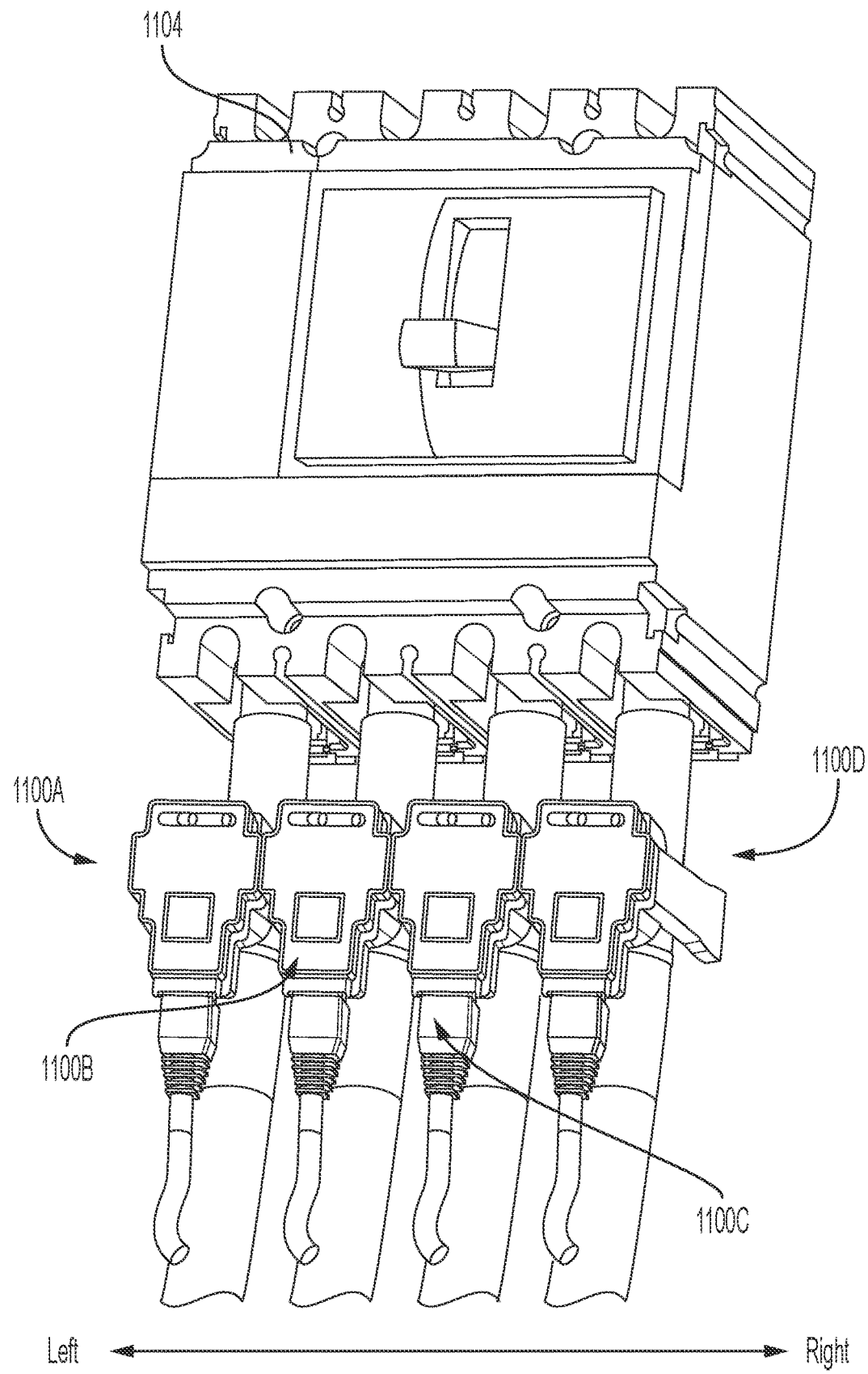
FIG. 11C illustrates linearly nested assemblies according to an example.

FIGS. 11A-11C illustrate how an assembly, generally indicated at 1100, within a shroud can be nested with other assemblies 1100 according to an example. As shown in FIG. 11A, the assembly 1100 includes a first corner 1102, a second corner 1104, a third corner 1106, a fourth corner 1108, a first side 1110, and a second side 1112. In some examples, each corner 1102, 1104, 1106, 1108 and side 1110, 1112 are part of the first shroud section of the shroud of the assembly (e.g., the first shroud section 302 of shroud 300 of FIG. 3A). The first corner 1102 is located in an upper-left position of the assembly 1100. The second corner 1104 is located in an upper-right position of the assembly 1100. The third corner 1106 is located in a lower-left position of the assembly 1100, and the fourth corner 1108 is located in a lower-right position of the assembly 1100. The first side 1110 is located on a left side of the assembly 1100 and the second side 1112 is located on a right side of the assembly 1100.

The first corner 1102 and fourth corner 1108 are configured to nest with each other. The second corner 1104 and the third corner 1106 are configured to nest with each other. The first side 1110 is configured to nest with the second side 1112. In some examples, each corner 1102, 1104, 1106, 1108 may be configured to nest with any other corner of the assembly 1100.

FIG. 11B illustrates an example of the assemblies 1100A-D nesting with each other in a staggered manner. Each assembly 1100A-1100D may be an assembly 1100 as shown in FIG. 11A. As shown in FIG. 11B, each assembly 1100 is secured to a wire (e.g., assembly 1100A is secured to wire 1102A, assembly 1100B is secured to wire 1102B, assembly 1100C is secured to wire 1102C, and assembly 1100D is secured to wire 1102D). The wires 1102A-1102D act as respective primary conductors for the assemblies 1100A-1100D. As shown in FIGS. 11B and 11C, the wires 1100A-1100D are coupled to a switch gear 1104. However, the switch gear 1104 may be any type of electrical equipment, such as a load or a voltage, current, or power source. The assemblies 1100A-1100D may be secured to their respective primary conductors, that is wires 1102A-1102D, by being in a closed position around the primary conductor and/or being tied to the primary conductor via a zip tie. Because the primary conductors are located relatively close together in the example of FIG. 11B, each assembly 1100A-1100D will be unable to pivot around its respective primary conductor, that is wires 1102A-1102D, because another primary conductor would get in the way.

The left-most assembly 1100A is nested with the left-center assembly 1100B. In particular, a first corner of the left-center assembly 1100B is nested with a fourth corner 1108 of the left-most assembly 1100A. The left-center assembly 1100B is nested with the right-center assembly 1100C. More particularly, a second corner of the left-center assembly 1100B is nested with a third corner of the right-center assembly 1100C. The right-center assembly 1100C is nested with the right-most assembly 1100D. More particularly, the first corner 1102 of the right-most assembly 1100D is nested with the fourth corner 1108 of the right-center assembly 1100C.

Nesting in the staggered manner illustrates in FIG. 11B may be continued indefinitely, with additional assemblies, such as assembly 1100, being added to continue the pattern. Furthermore, in some examples, the pattern need not be a simple staggered pattern as shown. For example, the left-most assembly 1100A and left-center assembly 1100B may be in the same position as shown, and the right-center assembly 1100C may be nested with the left-center assembly 1100B in the same manner the left-center assembly 1100B is nested with the left-most assembly 1100A. Instead of being "1-deep" the nesting pattern could be "3-deep" or "4-deep". Furthermore, the nesting pattern may change between any nesting pattern provided that adjacent assemblies are nested such that a first corner 1102 is nested with a fourth corner 1108, a second corner 1104 is nested with a third corner 1106, and a first side 1110 is nested with a second side 1112 as appropriate.

The staggered nesting allows a larger sensor than usual to be used on wiring that is either smaller or spaced closer together than usual. This is advantageous as it allows a user to use the same sensor (e.g., the same assembly 1100) over a wider range of installations.

FIG. 11C illustrates a linear nesting pattern for one or more assembly 1100. Aside from the nesting pattern, the conditions of the assemblies in FIG. 11C are identical to those of FIG. 11B. In FIG. 11C, the second side of the left-most assembly 1100A is nested with the first side 1110 of the left-center assembly 1100B. The second side 1112 of the left-center assembly 1100B is nested with the first side 1110 of the right-center assembly 1100C. The second side 1112 of the right-center assembly 1100C is nested with the first side 1110 of the right-most assembly 1100D.

As with FIG. 11B, the nesting pattern may vary between linear and various staggered nesting patterns.

Figure 12:
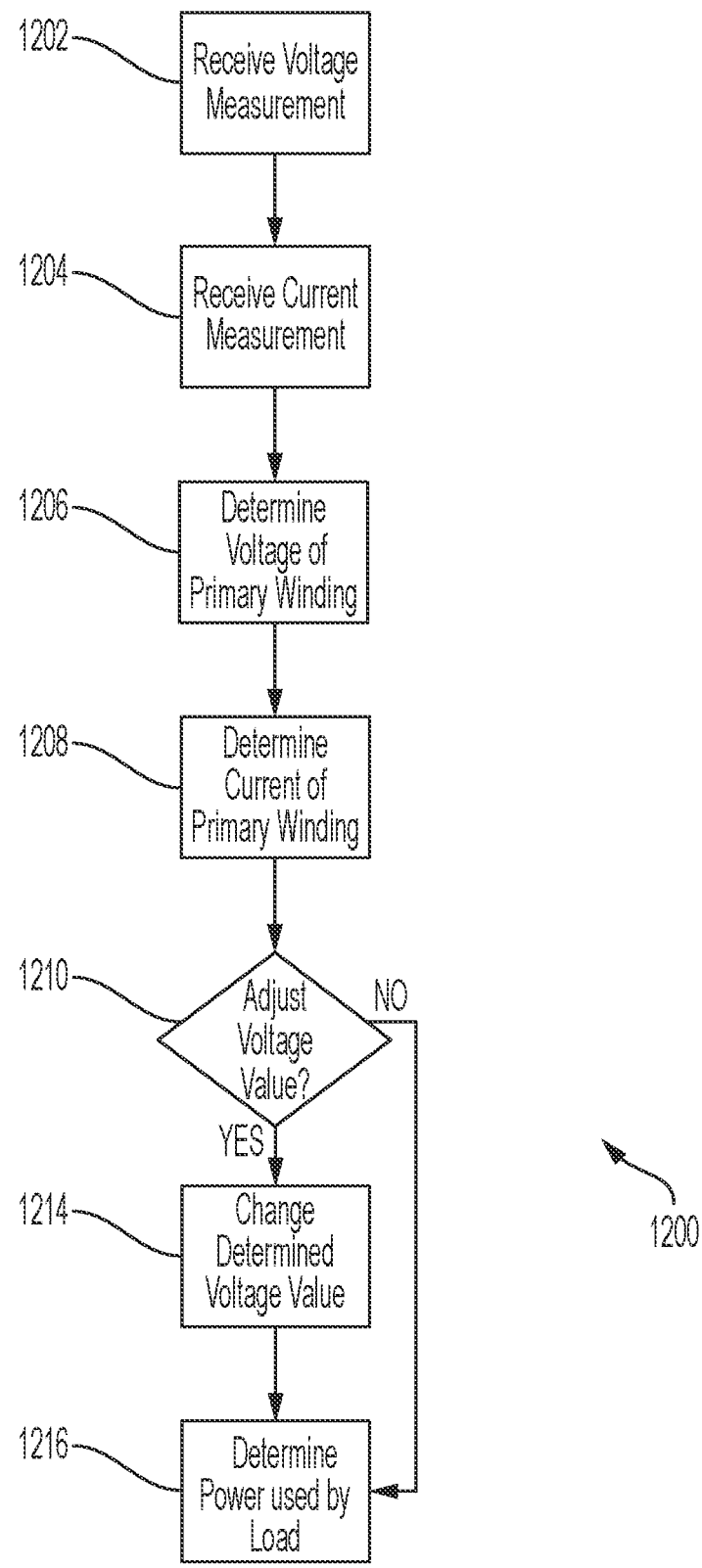
FIG. 12 illustrates a process for determining power and/or energy consumed by a load according to an example.

FIG. 12 illustrates a process, generally indicated at 1200, for determining power and/or energy consumed by a load according to an example. For an assembly (such as the assembly 200 or the assembly 1100), the assembly can determine power and/or energy consumed by a load connected to a primary conductor by measuring the voltage and current in the primary conductor, adjusting the measured values as required, and calculating the power and/or energy consumed by the load. The process 1200 describes one process by which the determination of the power and/or energy consumed by the load can be made. In the following description, the acts of the process 1200 will be described with respect to an assembly, such as the assembly 200 of FIG. 2A.

At act 1202, the assembly receives a voltage measurement from a voltage sensor. In some examples, the voltage sensor may be the voltage sensor 214 of the assembly 200. The voltage measurement may be stored for later use or may be provided to a controller (e.g., controller 202) or to another system. The process 1200 may then continue to act 1204.

At act 1204, the assembly receives a current measurement from a current sensor. In some examples, the current sensor may be the controller 202 reading a current in a secondary conductor of a core, the current in the secondary conductor being induced by the current in the primary conductor (e.g., the split core with the first core section 210 and second core section 212 and secondary conductor 218). The process 1200 may then continue to act 1206.

The acts 1202 and 1204 may be performed simultaneously. In general, the acts 1202 and 1204 are performed simultaneously so that the time relationship between the current and voltage measurements is as accurate as possible, thus allowing accurate calculation of the phase relationship between the voltage and current so that real and reactive power and/or energy may be accurately calculated. For example, when digital sampling of the voltage and current occurs, it is preferable that the sampling by synchronized for the voltage and current signals.

At act 1206, the assembly determines a voltage value based on the voltage measurement. For example, if the voltage sensor is a capacitive voltage sensor, the assembly may calculate the voltage of the primary conductor based on the voltage measurement using the relationships between charge, capacitance, voltage, impedance, and the principles of capacitive coupling. The process 1200 may then continue to act 1208.

At act 1208, the assembly determines the current of the primary conductor based on the current measurement. The assembly may determine the current in the primary conductor using the principles of inductive current. For example, by the equation:

$$I_s = \frac{N_p}{N_s} \cdot I_p \qquad (1)$$

where $I_s$ is the current in the secondary conductor, $N_p$ is the number of turns in the primary conductor, $N_s$ is the number of turns in the secondary conductor, and $I_p$ is the current in the primary conductor. The process 1200 may then continue to act 1210.

At act 1210, the assembly determines whether to adjust the voltage value determined at act 1206. For example, the assembly may determine that the voltage value must be adjusted due to the temperature of the voltage sensor or the ambient temperature, or due to calibration values provided to the assembly by another device, for example the voltage meter 104 or computer system 106 of FIG. 1. If the assembly determines to adjust the voltage value (1210 YES) the process 1200 may continue to act 1214. If the assembly determines not to adjust the voltage value (1210 NO) the process may continue to act 1216.

At act 1214, the assembly adjusts the voltage value. The assembly may adjust the voltage value to account for any factor, such as the temperature of the voltage sensor, the ambient temperature, or the calibration values. In some examples, the assembly may adjust the voltage value based on a machine learning algorithm or other intelligent process. The process 1200 may then continue to act 1216.

At act 1216, the assembly determines the power and/or energy consumed by a load coupled to the primary conductor. The assembly may determine the power and/or energy consumed by the load based on the voltage value and current value. In some examples, the power metering calculation is performed in discrete time using sampled values of the current and voltage in the primary conductor. Samples of the current and voltage are collected at many times the fundamental frequency of the power waveform and are used to determine real and reactive power and energy, as well as quantities like phase angle, harmonic content, and so forth.

The process 1200 may be repeated at intervals or executed continuously, and may be used to determine instantaneous power, power over time, RMS power, or any other type of power. The process 1200 may be executed by various parts of the assembly. For example, the controller (e.g., controller 202) may determine the voltage, current, and power and/or energy. In some examples, the controller and the voltage measurement circuit (e.g., controller 202 and voltage measurement circuit 206) may determines the voltage, current, and power and/or energy. In some examples, the machine learning algorithms may be executed by the computer system (e.g., computer system 106) or the voltage meter (e.g., voltage meter 104).

Figure 13:
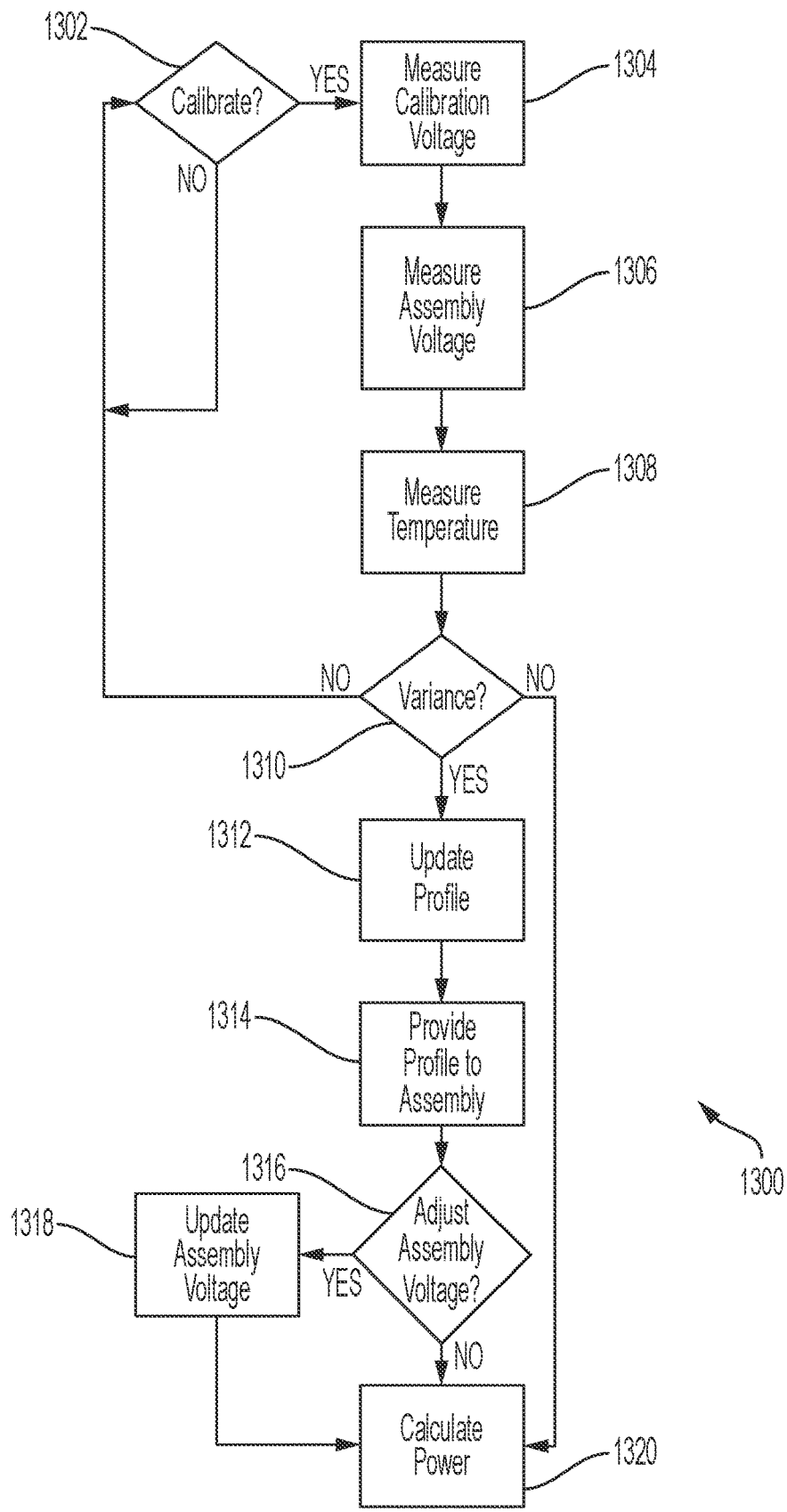
FIG. 13 illustrates a process for calibrating the voltage measured by the assembly.

FIG. 13 illustrates a process 1300 for calibrating the voltage detected by the assembly, according to an example. For the purposes of clarity, reference will be made to the computer system 106, voltage meter 104, and assembly 102 of FIG. 1 and to the controller 202 of FIG. 2 in the following explanation.

At act 1302, the assembly 202, the controller 202, computer system 106, or voltage meter 104 determines whether it is time to calibrate the voltage measured by the assembly 102. In some examples, the calibration is performed periodically, for example every few seconds, minutes, hours, days, and so forth, or continuously, and in other examples the calibration is performed when certain conditions are met (i.e., on demand). For example, calibration may occur responsive to the ambient temperature or the temperature of the voltage sensor changing by a threshold amount. Other examples include calibrating if the voltage measured by the assembly 102 (the "assembly voltage") changes by a threshold amount compared to previous reading—for example, because the sensor was moved and the voltage reading suddenly changed by a significant amount—or because the voltage reading has trended up or down for a threshold period of time, possibly indicating sensor drift. Other conditions will readily occur to a person of skill in the art. If the controller 202, computer system 106, or voltage meter 104 determines calibration is to be performed (1302 YES), the process 1300 continues to act 1304. If no calibration is determined to be performed (1302 NO), the process 1300 may terminate or may continue to monitor for conditions requiring calibration (i.e., repeat act 1302 until calibration is to be performed).

At act 1304, the voltage meter 104 measures the voltage of the power line, wire, or conductor corresponding to the assembly 102. For the purposes of clarity, the voltage measured by the voltage meter will be referred to as the "meter voltage," and the power line or wire or conductor will be referred to as the "primary conductor." The voltage meter then provides the meter voltage to the controller 202 and/or the computer system 106. The controller 202 and/or computer system 106 may record the meter voltage and any other data associated with the meter voltage (e.g., a time-stamp corresponding to when the meter voltage was taken or provided to the computer system 106, and so forth). The process 1300 then continues to act 1306.

At act 1306, the assembly 102 measures the voltage on the primary conductor to get the assembly voltage, and the controller 202 may provide the assembly voltage to the computer system 106. Other data associated with the assembly voltage (e.g., a time-stamp) may also be provided to the computer system 102 by the controller 202. In some examples, the data provided to the computer system 106 from the controller 202 may be relayed through the voltage meter 104 and/or provided to the voltage meter 104. The process 1300 then continues to act 1308.

At act 1308, the assembly 102 measures one or more temperatures. The assembly 102 may measure one or more of the temperature of the voltage sensor of the assembly 102, the temperature of the primary conductor, the ambient temperature around the primary conductor, the ambient temperature around the assembly 102, and so forth. The controller 202 receives the temperature data and may provide the temperature data to the computer system 106. In some examples, the controller 202 relays the temperature data to the computer system 106 through the voltage meter 104. The process 1300 then proceeds to act 1310.

At act 1310, the controller 202 determines if the assembly voltage deviates from the meter voltage. If the controller 202 determines that the assembly voltage deviates from the meter voltage, the controller 202 determines that there is a variance (1310 YES). In some examples, the controller 202 may only determine that a variance exists of the assembly voltage deviates from the meter voltage by a threshold amount. The threshold amount may be determined by the controller 202 and/or the computer system 106 using machine learning methods and algorithms, or may be set by a user, preprogrammed, or determined in other ways. In some examples, the threshold amount may be a statistically significant deviation in voltage indicating a high likelihood (>50%, >60%, >90%, or otherwise) that the assembly voltage is incorrect. If no deviation exists between the assembly voltage and meter voltage, or if the deviation in voltage is does not exceed the threshold amount, the controller 202 may determine that there is no variance (1310 NO). If the controller 202 determines there is no variance (1310 NO), the process 1300 may proceed to one or both of acts 1302 and 1320. If the controller 202 determines that a variance exists (1310 YES), the process 1300 proceeds to act 1312.

At act 1312, the controller 202 and/or the computer system 106 updates the calibration profile of the assembly 102. The controller 202 and/or computer system 106 may update the calibration profile of the controller 202 using a machine learning method or algorithm, and may retain the profile for future adjustments. In some examples, the profile is based on historical data (e.g., voltage, current, temperature) and the present assembly voltage, meter voltage, and temperature data. Once the controller 202 and/or computer system 106 has updated the calibration profile, the process 1300 continues to act 1314.

At act 1314, the controller 202 and/or computer system 106 provides the calibration profile to the controller 202. In some examples, the calibration profile is provided directly to the controller 202 by the computer system 106, and in some examples the calibration profile may be relayed via the voltage meter 104 from the computer system 106 to the controller 202. In some examples, the controller 202 generates and updates the calibration profile without using the computer system 106. The controller 202 loads the calibration profile and makes future voltage measurements using the calibration profile to adjust the measured voltage value to account for variations in position, temperature, and so forth. In this manner, the controller 202 and assembly 102 may take more accurate voltage readings that are more likely to reflect the true voltage (i.e., the meter voltage) of the primary conductor. The process 1300 then proceeds to act 1316.

At act 1316, the controller 202 determines whether the assembly voltage is to be updated based on the new calibration profile. If the assembly voltage is to be updated (1316 YES), the process 1300 continues to act 1318. If the assembly voltage is not to be updated (1316 NO), the process 1300 continues to act 1320. The controller 202 may determine that the assembly voltage is to be updated if the new calibration profile would cause the original assembly voltage to be different than it was originally measured to be.

At act 1318, the controller 202 updates the assembly voltage to reflect the adjustments based on the new calibration profile. The process 1300 then proceeds to act 1320.

At act 1320, the controller 202 determines the power and/or energy used by the load attached to the primary conductor based off the assembly voltage and a current measurement taken by the assembly 102. The controller 202 may then relay the power and/or energy used by the load to the computer system 106 or any other device configured to receive the power and/or energy measurement.

In the foregoing examples, the current transformer (e.g., core or split core, and secondary conductor) is only one type of current transducer that may be used. Other current transducers may also be used, for example, Rogowski coils, Hall Effect sensors, Anisotropic Magneto-Resistive sensors, and so forth. The voltage sensors mentioned herein may be capacitive, and may comprise a shielded planar sensing element, capacitive voltage divider, and isolation amplifier. The assembly may measure various parameters beyond voltage, current, and power and/or energy. Parameters the assembly can measure may include RMS current and voltage, real power and/or energy, reactive power and/or energy, energy, phase angle, harmonic content, transient events, and other commonly known power and/or energy quality parameters. In some examples, the assembly and/or voltage meter may dynamically determine the source impedance for all or part of a circuit, and thus compensate for any effect the measuring equipment (e.g., the assembly and/or voltage meter) have on the operation of the circuit to which the voltage meter and assembly are attached.

The temperature sensor of the voltage measurement circuit (e.g., voltage measurement circuit 206) may be configured to measure the temperature of the primary conductor rather than or in addition to the temperature of the voltage sensor.

The port (e.g., port 204) may provide both communication functionality and power to the assembly. For example, the port may be an IEEE 61869 RJ45 compliant connector using 1-wire data or industrial ethernet TIS with a power over Ethernet provision. In some examples, the port may instead be a dual port feature having an input Ethernet connection and an output Ethernet connection configured to provide daisy chain data and/or power to other assemblies. In some examples, the dual port feature may significantly reduce wiring complexity.

Various controllers, such as the controller 202, may execute various operations discussed above. Using data stored in associated memory and/or storage, the controller 202 also executes one or more instructions stored on one or more non-transitory computer-readable media, which the controller 202 may include and/or be coupled to, that may result in manipulated data. In some examples, the controller 202 may include one or more processors or other types of controllers. In one example, the controller 202 is or includes at least one processor. In another example, the controller 202 performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

In some examples, controllers discussed herein may be implemented as digital signal processing circuits ("DSP circuits") for processing the voltage and current signals and providing those signals to other devices and/or circuits.

The conductors mentioned herein, such as the primary and secondary conductors, may be any type of conductive material. For example, the conductors may be conductive wires and may be insulated (e.g., surrounded by an insulating sheath such as a rubber and/or polyethylene sheath).

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. An energy metering assembly configured to measure current and voltage of one or more primary conductors, the energy metering assembly comprising:
 a current sensor configured to sense a current of the one or more primary conductors;
 a non-contact voltage sensor, the voltage sensor being configured to sense a voltage of the one or more primary conductors; and
 a controller communicatively coupled to the voltage sensor, the controller being configured to
  receive a voltage calibration measurement,
  determine a voltage of the one or more primary conductors based at least in part on the voltage calibration measurement,
  determine a current of the one or more primary conductors, and
  responsive to determining the voltage and the current, determine the power carried by the one or more primary conductors.

2. The system of claim 1, wherein a voltage meter is coupled to the one or more primary conductors and communicatively coupled to the energy metering assembly and configured to provide the voltage calibration measurement to the controller.

3. The system of claim 2, wherein the voltage meter provides the voltage calibration measurement to the controller at intervals.

4. The system of claim 1, further comprising a voltage measurement circuit coupled to the voltage sensor and configured to provide a processed analog signal to the controller, the analog signal being indicative of at least one or more of the voltage magnitude and phase of the voltage of the one or more primary conductors.

5. The system of claim 4, wherein the controller determines the voltage of the one or more primary conductors responsive to receiving the processed analog signal provided by the voltage measurement circuit.

6. The system of claim 4, further comprising a flexible bus having at least two ends, the flexible bus being coupled to the voltage measurement circuit at one end and coupled to the controller at another end.

7. The system of claim 1, further comprising a temperature sensor configured to sense a temperature of the one or more primary conductors and provide the temperature to the controller.

8. The system of claim 7, where the controller is further configured to adjust the voltage responsive to receiving the temperature provided by the temperature sensor.

9. The energy metering assembly of claim 1, wherein the voltage sensor detects an electrical field that is proportional to the voltage.

10. The energy metering assembly of claim 1, wherein the voltage sensor is coupled to a flexible bus, and the flexible bus is coupled to the controller.

11. The energy metering assembly of claim 1, wherein the voltage sensor is rigidly coupled to a circuit configured to process the voltage and provide a processed voltage signal to the controller.

12. The energy metering assembly of claim 11, wherein the controller is further configured to receive input from a temperature sensor configured to measure a temperature of the one or more primary conductors.

13. The energy metering assembly of claim 1, further comprising a voltage meter configured to communicatively couple to the energy metering system and configured to measure the voltage of the one or more primary conductors.

14. The energy metering assembly of claim 13, wherein the voltage meter is configured to provide a voltage reading to the energy metering assembly.

15. The energy metering assembly of claim 14, wherein the energy metering system is configured to request the voltage reading and to calibrate the voltage sensor using the voltage reading.

16. The energy metering assembly of claim 13, wherein the voltage meter provides one or more voltage readings at intervals.

17. The energy metering assembly of claim 1 further comprising
 a first sensor configured to sense a temperature of the one or more primary conductors, and
 a second sensor configured to sense an ambient temperature of the energy metering assembly.

18. The energy metering assembly of claim 17 wherein the controller is further configured to
 compare the temperature of the one or more primary conductors and the ambient temperature to one or more historical temperature data indicative of historical temperatures of the one or more primary conductors and historical ambient temperatures,
 detect, based on the ambient temperature and the historical temperature data, a change in the temperature of the one or more primary conductors indicative of a fault.

19. The energy metering assembly of claim 18 wherein the fault includes at least one of bonding trending to failure, electrical contacts trending to failure, corrosion, connections loosening with time, or other issues leading to abnormal heating of the one or more primary conductors.

20. The energy metering assembly of claim 1 wherein the controller is further configured to
 calibrate the energy metering assembly when current carried on the one or more primary conductors is below a threshold current level,
 detect a second voltage of the one or more primary conductors when current carried on the one or more primary conductors is above a threshold current level,
 characterize a difference between voltage and the second voltage when current carried on the one or more primary conductors is above the threshold current level,
 determine a normal impedance of the one or more primary conductors, and
 provide an alarm when an impedance of the one or more primary conductors deviates by a threshold impedance amount from the normal impedance.

21. The energy metering assembly of claim 20 wherein the impedance of the one or more primary conductors is an impedance of an electrical distribution system between a voltage meter and the energy metering assembly.

22. A method of determining power provided to a load, comprising:
 taking a voltage measurement of a one or more primary conductors;
 taking a current measurement of a secondary conductor;
 responsive to taking the voltage measurement of the one or more primary conductors, determining a voltage value of the one or more primary conductors;
 responsive to sensing the current measurement of the secondary conductor, determining a current value of the one or more primary conductors based on the current measurement of the secondary conductor;
 receiving a voltage calibration measurement;
 responsive to receiving the voltage calibration measurement, adjusting the voltage value based on the voltage calibration measurement; and responsive to adjusting the voltage value, determining the power provided to the load based on the voltage value and the current value.

23. The method of claim 22, further comprising requesting voltage calibration measurements and adjusting the voltage value based on the voltage calibration measurements at intervals.

24. The method of claim 22, further comprising sensing a temperature of the one or more primary conductors, and adjusting the voltage value based on the temperature of the one or more primary conductors.

25. The method of claim 24, further comprising adjusting the voltage value based on the temperature at a first circuit and further adjusting the voltage value based on the voltage calibration measurement at a second circuit.

26. The method of claim 22, wherein the voltage calibration measurement is received from a voltage meter configured to directly sense a voltage of the one or more primary conductors at a point different from the point where the voltage measurement is taken.

27. A non-transitory, computer-readable medium containing computer-executable instructions thereon, the instructions instructing at least one processor to:
   receive a voltage measurement of a one or more primary conductors;
   receive a current measurement of a secondary conductor;
   responsive to receiving the voltage measurement of the one or more primary conductors, determine a voltage value of the one or more primary conductors;
   responsive to receiving a current measurement of the secondary conductor, determine a current value of the one or more primary conductors based on the current measurement of the secondary conductor;
   receive a voltage calibration measurement;
   responsive to receiving the voltage calibration measurement, adjust the voltage value based on the voltage calibration measurement; and
   responsive to adjusting the voltage value, determine a power used by a load based on the voltage value and the current value.

28. The non-transitory, computer-readable medium of claim 27, wherein the instructions further instruct the at least one processor to request voltage calibration measurements and adjust the voltage value based on the voltage calibration measurements at intervals.

29. The non-transitory, computer-readable medium of claim 27, wherein the instructions further instruct the at least one processor to receive a temperature of the one or more primary conductors and adjust the voltage value based on the temperature of the one or more primary conductors.

30. The non-transitory, computer-readable medium of claim 27, wherein the instructions further instruct the at least one processor to adjust the voltage value based on the temperature of the one or more primary conductors at a first location and adjust the voltage value based on the voltage calibration measurements at a second location different from the first location.

31. The non-transitory, computer-readable medium of claim 27, wherein the instructions further instruct the at least one processor to receive the voltage calibration measurement from a voltage meter configured to directly sense a voltage of the one or more primary conductors.

32. A method of calculating a characteristic impedance of a power distribution system comprising:
   determining a first voltage at a first point in the power distribution system;
   determining a second voltage at a second point in the power distribution system;
   determining a current carried through the power distribution system;
   determine, based on one or more of the first voltage, the second voltage, and the current, an impedance of the power distribution system between the first point and the second point;
   monitor the impedance over time;
   based on the impedance over time, determine a characteristic impedance of the power distribution system between the first point and the second point; and
   provide a notification responsive to the resistance of the power distribution system varying by at least a threshold impedance amount away from the characteristic impedance.

33. The method of claim 32 further comprising:
   receiving a voltage calibration measurement;
   responsive to receiving the voltage calibration measurement, adjusting one or more of the first voltage or the second voltage to produce an adjusted voltage value; and
   determine the impedance based at least in part on the adjusted voltage value.

34. The method of claim 32 further comprising adjusting at least one of the first voltage or second voltage based on a temperature of a primary conductor of the power distribution system, wherein the temperature is normalized against the current.

* * * * *